(12) United States Patent
Yagi et al.

(10) Patent No.: US 7,973,871 B2
(45) Date of Patent: Jul. 5, 2011

(54) ACTIVE MATRIX SUBSTRATE, METHOD FOR CORRECTING A PIXEL DEFFECT THEREIN AND MANUFACTURING METHOD THEREOF

(75) Inventors: Toshifumi Yagi, Tsu (JP); Masanori Takeuchi, Tsu (JP); Toshihide Tsubata, Tsu (JP); Nobuyoshi Nagashima, Matsusaka (JP); Akira Yamaguchi, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1100 days.

(21) Appl. No.: 11/597,432

(22) PCT Filed: May 27, 2005

(86) PCT No.: PCT/JP2005/010211
§ 371 (c)(1),
(2), (4) Date: Nov. 22, 2006

(87) PCT Pub. No.: WO2005/116745
PCT Pub. Date: Dec. 8, 2005

(65) Prior Publication Data
US 2008/0049155 A1 Feb. 28, 2008

(30) Foreign Application Priority Data

May 27, 2004 (JP) ................................. 2004-158127
Nov. 16, 2004 (JP) ................................. 2004-332472
Mar. 29, 2005 (JP) ................................. 2005-096262

(51) Int. Cl.
*G02F 1/1333* (2006.01)
*G02F 1/1343* (2006.01)
*G02F 1/13* (2006.01)
*H01J 9/24* (2006.01)

(52) U.S. Cl. ............... 349/54; 349/39; 349/192; 445/24
(58) Field of Classification Search ..................... 349/54
See application file for complete search history.

(56) References Cited

U.S. PATENT DOCUMENTS

| 6,100,948 A | 8/2000 | Kim et al. |
| 6,285,431 B2 | 9/2001 | Lyu et al. |
| 6,462,792 B1 * | 10/2002 | Ban et al. ......................... 349/39 |
| 6,839,099 B2 * | 1/2005 | Fukunishi ....................... 349/54 |

(Continued)

FOREIGN PATENT DOCUMENTS
JP      59-101693      6/1984
(Continued)

OTHER PUBLICATIONS

International Search Report for PCT/JP2005/010211 mailed Oct. 4, 2005.

(Continued)

*Primary Examiner* — Sarah Hahm
(74) *Attorney, Agent, or Firm* — Nixon & Vanderhye P.C.

(57) ABSTRACT

The present invention provides an active matrix substrate of comprising on the substrate: a plurality of scanning signal lines and data signal lines; a thin film transistor provided at an intersecting point of the signal lines and comprising a gate electrode connected to the scanning signal line, a source electrode connected to the data signal line; and a pixel electrode electrically connected to a drain electrode of the thin film transistor, wherein the active matrix substrate comprises a structure having an at least partly multilinear data signal line and an interconnection electrode for correction.

43 Claims, 19 Drawing Sheets

U.S. PATENT DOCUMENTS 6,862,052 B2 * 3/2005 Kim .................. 349/54
7,057,695 B2    6/2006 Mun et al.

FOREIGN PATENT DOCUMENTS

| | | |
|---|---|---|
| JP | 2-135320 | 5/1990 |
| JP | 7-199221 | 8/1995 |
| JP | 8-328035 | 12/1996 |
| JP | 09-054340 | 2/1997 |
| JP | 9-090420 | 4/1997 |
| JP | 9-152625 | 6/1997 |
| JP | 9-311642 | 12/1997 |
| JP | 10-232412 | 9/1998 |
| JP | 10-333170 | 12/1998 |
| JP | 11-084421 | 3/1999 |
| JP | 11-282007 | 10/1999 |
| JP | 2000-250436 | 9/2000 |
| JP | 2001-083523 | 3/2001 |
| JP | 2001-117083 | 4/2001 |
| JP | 2001-281690 | 10/2001 |
| JP | 2002-023195 | 1/2002 |
| JP | 2002-122869 | 4/2002 |
| JP | 2002-350901 | 12/2002 |

OTHER PUBLICATIONS

International Preliminary Report on Patentability mailed Nov. 29, 2006 in corresponding PCT Application No. PCT/JP2005/010211.

* cited by examiner

ACTIVE MATRIX SUBSTRATE, METHOD FOR CORRECTING A PIXEL DEFFECT THEREIN AND MANUFACTURING METHOD THEREOF

This application is the US national phase of international application PCT/JP2005/010211 filed 27 May 2005, which designated the U.S. and claims priority to JP 2004-158127 filed 27 May 2004, JP 2004-332472 filed 16 Nov. 2004, and JP 2005-096262 filed 29 Mar. 2005, the entire content of each of which is hereby incorporated by reference.

BACKGROUND OF THE INVENTION

1. Field of the Invention

The present invention relates to an active matrix substrate, pixel defect correcting method and its manufacturing method. More particularly, it relates to an active matrix substrate especially suitable for a component member of a liquid crystal display device having a pixel-divided (multi-pixel) structure, its pixel defect correcting method and manufacturing method, and a liquid crystal display device and its manufacturing method.

2. Background Art

An active matrix substrates is widely used in active matrix display devices such as a liquid crystal display device, a EL (Electro Luminescence) display device and the like. According to the active matrix substrate used in a conventional active matrix display device, a switching element such as a TFT (Thin Film Transistor) and the like is provided at each intersecting point between a plurality of scanning signal lines and a plurality of data signal lines arranged on the substrate so as to intersect with each other. An image signal is appropriately transferred to each pixel (electrode) part connected to the TFT and the like, by a switching function of the TFT and the like. In addition, in order to prevent deterioration of the image signal caused by a self-discharge of a liquid crystal layer or an off current of the TFT and the like while the TFT is off, or to be used in a path and the like to apply various kinds of modulation signals in liquid crystal driving, there is provided an active matrix substrate having a storage capacitor element in each pixel part.

As a constitution of the active matrix substrate used in the conventional active matrix liquid crystal display device, the following constitution is known (refer to Japanese Kokai Publication No. 09-152625 (PP. 1 and 19, FIG. 7), for example).

FIG. 23 is a schematic plan view showing one pixel of the active matrix substrate provided in the conventional active matrix liquid crystal display device.

As shown in FIG. 23, a plurality of pixel electrodes 51 are provided on the conventional active matrix substrate in the shape of a matrix. The scanning signal line 52 to supply a scanning line signal and the data signal line 53 to supply a data signal pass around the pixel electrode 51 and intersect with each other. In addition, as a switching element to be connected to the pixel electrode, the TFT 54 is provided at an intersecting part between the scanning signal line 52 and the data signal line 53. The scanning signal line 52 is connected to a gate electrode of the TFT 54 and the TFT 54 is driven and controlled when the scanning signal is inputted. In addition, the data signal line 53 is connected to a source electrode of the TFT 54 so that the data signal is inputted. Furthermore, the drain extraction wiring 55 is connected to a drain electrode of the TFT 54, one electrode 55a of the storage capacitor element (a storage capacitor upper electrode) is connected to the drain extraction wiring 55, and the pixel electrode 51 is connected to the storage capacitor upper electrode 55a through the contact hole 56. The storage capacitor (common) wiring 57 functions as the other electrode of the storage capacitor element (a storage capacitor lower electrode).

FIG. 24 is a schematic sectional view showing one pixel of the conventional active matrix substrate taken along line A-A' shown in FIG. 23.

As shown in FIG. 24, the conventional active matrix substrate comprises the gate electrode 62 connected to the scanning signal line 52, and the storage capacitor (common) wiring 57 on the transparent insulation substrate 61 formed of glass, plastic and the like. The scanning signal line 52 and the gate electrode 62 are formed of a metal film such as titanium, chrome, aluminum, molybdenum and the like, their alloy film or their laminated film by sputtering and the like, and then patterned by photo-etching and the like. The storage capacitor (common) wiring 57 is formed of the same material as that of the scanning signal line 52 and the gate electrode 62.

In addition, the gate insulator 63 is provided so as to cover the gate electrode 62 and the storage capacitor (common) wiring 57. The gate insulator 63 comprises an insulation film such as a silicon nitride film, a silicon oxide film, a metal oxide film and the like. Thereon provided is the high-resistance semiconductor layer 64 formed of amorphous silicon, polysilicon and the like so as to overlap with the gate electrode 62, and thereon provided as an ohmic contact layer is a low resistance semiconductor layer formed of $n^+$ amorphous silicon and the like doped with an impurity such as phosphorus which becomes the source electrode 66a and the drain electrode 66b. The insulation film, amorphous silicon, n+ amorphous silicon and the like are formed by plasma CVD (Chemical Vapor Deposition) and the like and patterned by photo-etching.

In addition, the data signal line 53 is provided so as to connect to the source electrode 66a. In addition, the drain extraction wiring 55 is provided so as to be connected to the drain electrode 66b. The drain extraction wiring 55 is elongated to constitute the storage capacitor upper electrode 55a which is the one electrode of the storage capacitor element and it is connected to the pixel electrode 51 through the contact hole 56. The data signal line 53, the drain extraction wiring 55 and the storage capacitor upper electrode 55a are formed of the same material and a metal film comprising titanium, chrome, aluminum, molybdenum and the like, their alloy film or their laminated film by sputtering and patterned by photo-etching. The pixel electrode 51 is formed of a transparent conductive film such as ITO (Indium Tin Oxide), IZO (Indium Zinc Oxide), tin oxide, zinc oxide and the like. The contact hole 56 is formed so as to penetrate the interlayer insulation film 68 formed so as to cover the TFT 54, the scanning signal line 52, the data signal line 53 and the drain extraction wiring 55. Examples of materials of the interlayer insulation film 68 include an acrylic resin, silicon nitride, silicon oxide and the like.

According to the active matrix substrate having the above constitution, in order to simplify its manufacturing process and reduce its manufacturing cost, the storage capacitor (common) wiring (the storage capacitor lower electrode) 57 is formed at the same step as that of the scanning signal line 53 and the storage capacitor upper electrode 55a is formed at the same step as that of the data signal line 53 and the drain extraction wiring 55.

Like the active matrix substrate shown in FIGS. 23 and 24, when the pixel electrode is formed on the interlayer insulation film, the pixel electrode may overlap with each signal line. And therefore a high aperture ratio may be obtained and an electric field from each signal line to the pixel electrode may be shielded. At this time, as shown in FIG. 23, by forming the contact hole 56 in the interlayer insulation film 68 to connect the pixel electrode 51 to the storage capacitor upper electrode 55a, the pixel electrode 51 and the drain electrode 66b are connected through the drain extraction electrode (wiring) 55. The position of the contact hole 56 is not necessarily formed above the storage capacitor upper electrode 55a and it may be formed above the drain extraction electrode (wiring) 55. And when it is formed above the storage capacitor upper electrode 55a positioned above the storage capacitor (common) wiring pattern 57 as shown in FIG. 23, the aperture ratio is not further reduced.

Recently, in a liquid crystal display device used in a large liquid crystal TV and the like, in order to increase viewing angle, a VA (Vertical Alignment) method having a multi-domain, that is, an MVA (multi-domain Vertical Alignment) method has been widely spread (refer to Japanese Kokai Publication No. 2002-122869 (PP. 2 and 21, FIG. 2), for example and Japanese Kokai Patent Publication No. 2001-83523 (PP. 1 and 55, FIG. 17), for example). According to the MVA method, the wide viewing angle is implemented by providing a removal pattern or a protrusion for controlling an alignment of a liquid crystal molecule in the pixel electrode of the active matrix substrate and an opposed electrode of an opposed substrate and using a formed fringe field to disperse the alignment direction of the liquid molecule to a plurality of directions. In addition, also in the conventional active matrix substrate shown in FIGS. 23 and 24, the wide viewing angle may be implemented by providing the removal pattern or the protrusion for controlling an alignment of the liquid crystal molecule in the pixel electrode of the active matrix substrate and the opposed electrode of the opposed substrate.

In addition, in order to prevent a light leakage and improve an initial response speed after application of a voltage, there is a technique in which an electrode is buried in a position corresponding to the removal pattern (referred to as an electrode slit also hereinafter) of the pixel electrode or the opposed electrode (refer to Japanese Kokai Patent Publication No. 10-333170 (PP. 1, 2, and 4) and Japanese Kokai Patent Publication No. 2001-117083 (PP. 1, 2, 4, 6, and 12, FIG. 21), for example).

In the manufacturing process of the active matrix substrate, a short circuit (leak) may generate between the source electrode and the drain electrode of the TFT, or the drain electrode or the drain extraction wiring is broken because of a foreign material, a film remaining and the like. In addition, an operation defect of the TFT may generate because the ohmic contact is insufficiently provided. Thus, a normal voltage (drain voltage) is not applied to the pixel electrode of the pixel in which the defect is generated, so that a point defect such as a luminance point or a black point is generated on a display screen in the liquid crystal display device, resulting in reduction of a manufacturing yield of the liquid crystal display device.

Regarding correction of such a pixel defect, a liquid crystal display panel or a liquid crystal display device having a structure in which an interconnection wiring for correction is previously provided between the pixel and the adjacent pixel has been disclosed (refer to Japanese Kokai Publication No. 59-101693 (P. 1), Japanese Kokai Publication No. 2-135320 (PP. 1 and 4, FIG. 1), Japanese Kokai Patent Publication No. 8-328035 (PP. 1 and 5, FIG. 1), and Japanese Kokai Patent Publication No. 2002-350901 (PP. 17 and 24, FIG. 20), for example). According to the above, when the pixel defect is generated, the pixel in which the pixel defect is generated may be driven by applying laser to the interconnection wiring for correction to electrically connect the pixel electrode of the pixel in which the pixel defect is generated to the pixel electrode of the adjacent pixel and applying a voltage of the same potential as that of the adjacent pixel.

However, there is room for improvement in this method in view of the following points. That is, the pixels are insulated in a normal state (at the time of normal operation) and it is necessary that the interconnection wiring for correction runs over the pixels. Therefore increase of an area of the interconnection wiring for correction may reduce the aperture ratio. In addition, even when the drain electrode or the drain extraction wiring is broken, the defect should be corrected in the own pixel since the TFT of the pixel in which the line is broken can normally operate. The reason is when the pixel in which the line is broken is driven through the interconnection wiring for correction, an extra driving load is applied to the TFT of the adjacent pixel. Meanwhile, according to the above method for correcting the pixel defect, the correction can be made only by connecting the adjacent pixels and the correction cannot be made in the own pixel.

In addition, regarding a method for solving a TFT defect, disclosed is a structure of a liquid crystal display device having a redundant structure in which a plurality of TFTs are connected in parallel in one pixel. (refer to Japanese Kokai Publication No. 07-199221 (PP. 1 and 6, FIG. 1), for example). However, according to this structure of the liquid crystal display device, there is room for improvement because the pixel defect cannot be corrected when all TFTs in the pixel become defective.

In addition, regarding a method for restoring the point defect of the transparent pixel electrode because of the defect of the TFT, disclosed is a constitution of a liquid crystal display device comprising a redundant circuit other than the switching element which can connect at least one of the scanning line (scanning signal line) and the signal line (data signal line) to the pixel electrode (refer to Japanese Kokai Publication No. 11-282007(PP. 1 and 2), for example). However, according to this constitution of the liquid crystal display device, since the signal line and the transparent pixel electrode are the same potential, the luminance point or a decalescence point of the transparent pixel electrode can be a semi-luminescence point, but the pixel defect cannot be perfectly corrected.

SUMMARY OF THE INVENTION

The present invention was made in view of the above mentioned problems and it is an object of the present invention to provide an active matrix substrate, a method of for correcting a pixel defect therein its and a manufacturing method, and a liquid crystal display device and its a manufacturing method, in which regarding a pixel defect caused by a short circuit between a source electrode and a drain electrode because of a foreign material and a film remaining and the like, or by breaking of the drain electrode or a drain extraction wiring, or a TFT operation defect and the like, a pixel which is a point defect may be easily and surely corrected without reducing an aperture ratio, and an yield of the liquid crystal display device may be improved.

While the inventors of the present invention studied about the active matrix substrate having a structure in which the pixel defect can be corrected, they focused on using a data signal line as a part of an alternative path for correction when the pixel defect was corrected. Thus, they found that even when the pixel defect was generated in the manufacturing process of the active matrix substrate, the pixel of the point defect could be easily and surely corrected without reducing the aperture ratio by constituting the active matrix substrate having a structure having the at least partly multilinear data signal line and comprising an interconnection electrode for correction. In addition, the above mentioned interconnection electrode for correction means an electrode having a structure in which the multilinear part of the data signal line can be connected to the signal line and the electrode on the output (drain) side of the thin film transistor in a post-process when the pixel defect is corrected. Thus, the pixel defect may be corrected since the multilinear part of the data signal line is connected to the signal line and the electrode on the output side to constitute an alternative path to input a signal to the multilinear part of the data signal line and the signal line and the electrode on the output side when a short circuit is generated between the input (source) side and the output side of the thin film transistor, or the line is broken on the output side.

In addition, the present inventors found that a wiring structure having an overlapping part of a wiring part and the multilinear part of the data signal line and an overlapping part of a wiring part and a circuit part connecting the thin film transistor to the pixel electrode, and at least one of the overlapping parts provided through an insulation film is preferable as a interconnection electrode for correction. That is, as shown in FIG. 1, in the active matrix substrate with a pixel structure having (a) the data signal lines 23 and 23' partly multilinear, and (b) the interconnection electrodes for correction (wiring structures) 28 and 28' which are formed in the same step as that of the scanning signal line, and which can be connected to the drain extraction wiring 25 and the data signal line 23', even when a short circuit (S-D leakage) is generated at a channel part of the thin film transistor 24 or a region between the data signal line 23 and drain extraction wiring 25 because of a film remaining and the like in the pixel, and the pixel becomes the point defect, according to a correction method comprising (1) a step of separating the thin film transistor 24 by destructively separating the drain extraction wiring 25 of the pixel having the point defect using laser and the like, (2) a step of connecting the drain extraction wiring 25 and the data signal line 23' to the interconnection electrodes for correction 28 and 28' in both pixel in which the point defect is generated and its, adjacent pixel by irradiating the drain extraction wiring 25 and the data signal line 23' on the interconnection electrodes for correction 28 and 28' with the laser, and (3) a step of destructively separating a periphery of a region used for an alternative path of the multilinear data signal line 23', it is found that a drain voltage of substantially the same potential as that of the adjacent pixel could be written to the pixel by connecting the drain extraction wiring of the adjacent pixel to the drain extraction wiring of the pixel having the point defect, and that pixel can be driven like the normal pixel. As a result, the above problems can be completely solved, leading to a completion of the present invention.

Thus, the present invention provides an active matrix substrate comprising on the substrate: a plurality of scanning signal lines and data signal lines; a thin film transistor provided at an intersecting point of the signal lines and comprising a gate electrode connected to the scanning signal line, a source electrode connected to the data signal line; and a pixel electrode electrically connected to a drain electrode of the thin film transistor, wherein the data signal line comprises an at least partly multilinear part, the active matrix substrate comprises a wiring structure having an overlapping part of a part of the wiring structure and the multilinear part of the data signal line, an overlapping part of apart of a wiring structure and a circuit part connecting the thin film transistor to the pixel electrode, and at least one of the overlapping parts provided through an insulating film.

BRIEF DESCRIPTION OF THE DRAWINGS

FIG. 4-1 is a schematic plan view showing a variation of the constitution of the pixel of the active matrix substrate shown in FIG. 1.

FIG. 4-2 is a circuit diagram showing a circuit constitution of the active matrix substrate shown in FIG. 4-1.

EXPLANATION OF NUMERALS AND SYMBOLS

Figure 1:
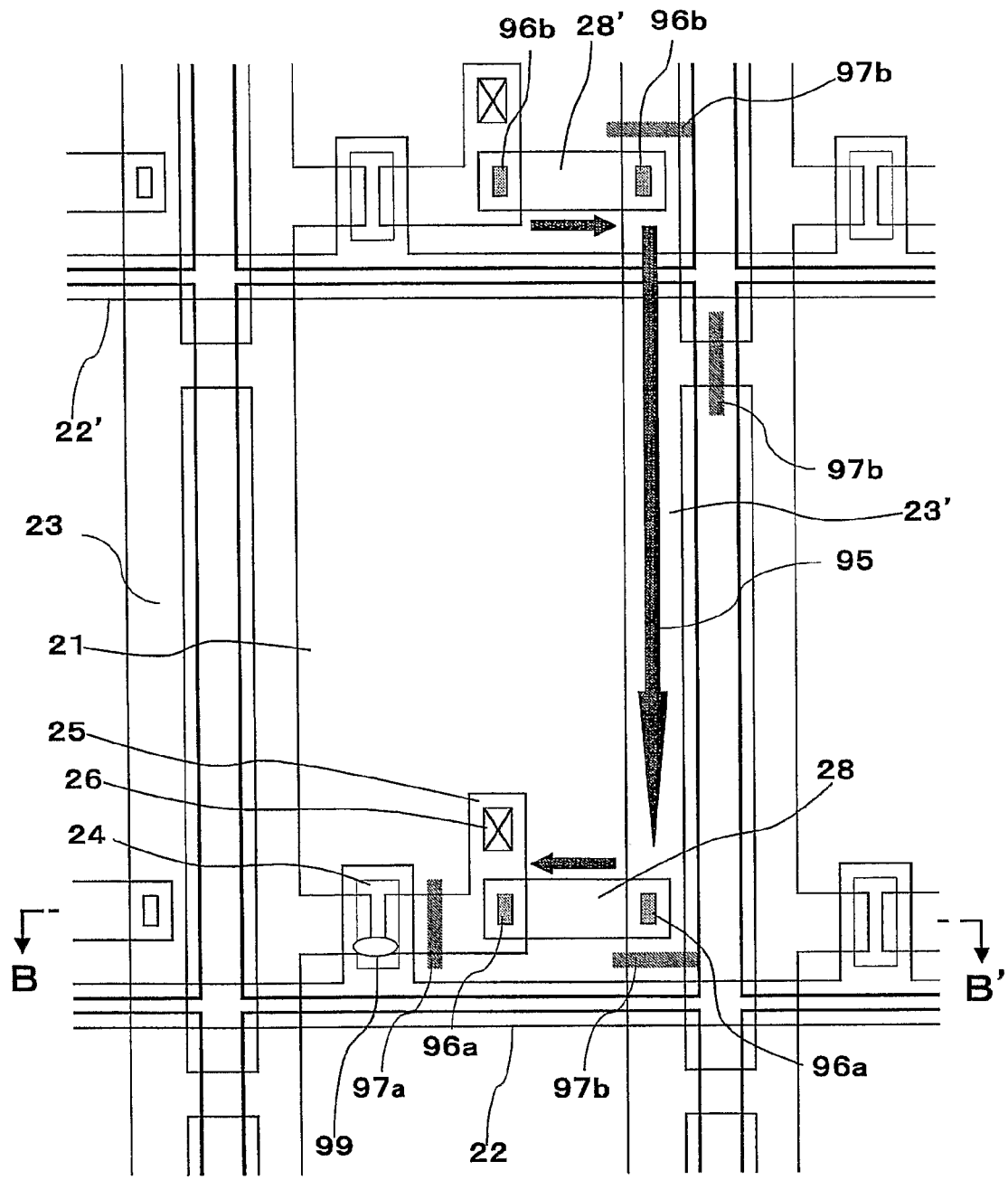
FIG. 1 is a schematic plan view showing a constitution of a pixel of an active matrix substrate according to an embodiment 1.

10: A picture element
11: A couple of picture elements used for correction with each other
20: Pixel electrode, opposed electrode, and liquid crystal layer
21: Pixel electrode (inside the wide line)
21a, 21a': Sub-pixel electrode
21b: Sub-pixel electrode 2
22: Scanning signal line
22': Adjacent (next-stage) scanning signal line
23: Data signal line
23': Adjacent (next-stage) data signal line
23a: elongated part of an adjacent (next-stage) data signal line (an elongated part from 23' and serves as a connection part to an interconnection electrode for correction)
23b: Multilinear part of a data signal line
24: Thin film transistor (TFT)
25: Drain extraction wiring
25a: Storage capacitor upper electrode
25b: Storage capacitor upper electrode 2 (an elongated part from 25, 25a and serves as a connection part to an interconnection electrode for correction)
25c: Storage capacitor upper electrode 3
26: Contact hole
27: Storage capacitor wiring
28: Interconnection electrode for correction
28': Interconnection electrode for correction
28": Interconnection electrode for correction
28a: Interconnection electrode for correction (elongated from a storage capacitor wiring part)
29a: Transparent electrode slit (for controlling an alignment) (on TFT side or CF side)
29b: Protrusion for controlling an alignment
30: Active matrix substrate
31: Insulating substrate
32: Gate electrode
33: Gate insulator
34: High-resistance semiconductor layer
36a: Source electrode
36b: Drain electride
38' Interlayer insulating film
38a: Protective layer
38b: Flatted film
40: Opposed substrate (color filter substrate)
41: Insulating substrate (opposed substrate, color filter substrate)
42: Light shield layer (black matrix)
43a: Colored layer 1
43b: Colored layer 2
43c: Colored layer 3
44: Opposed electrode
45: Liquid crystal layer
46: Overcoat layer
51: Pixel electrode (inside the wide line)
52: Scanning signal line
53: Data signal line
54: Thin film transistor (TFT)
55: Drain extraction electrode
55a: Storage capacitor upper electrode
56: Contact hole
57: Storage capacitor (common) wiring (storage capacitor lower electrode)
61: Insulating substrate
62: Gate electrode
63: Gate insulator
64: High-resistance semiconductor layer
66a: Source electrode
66b: Drain electrode
68: Interlayer insulating film
95: Alternative path
95': Alternative path (for breaking of drain)
96': Laser irradiation part M
96a, 96a1, 96a1', 96a2: Laser irradiation part M (in own pixel)
96b: Laser irradiation part M (in adjacent pixel)
96c: Laser irradiation part M (in own pixel)
97a: Laser irradiation part C (breaking of a drain extraction wiring)
97b, 97b': Laser irradiation part C (breaking of other date signal lines)
97c, 97c1', 97c1', 97c2, 97c2': Laser irradiation part C (breaking of an elongated part of a storage capacitor wiring)
97d: Laser irradiation part C (breaking of own data signal line)
98: Wiring Breaking (defect) part
99: Film remaining (defect) part

DETAILED DESCRIPTION OF THE INVENTION

An active matrix substrate according to the present invention comprises a plurality of scanning signal lines and data signal lines; a thin film transistor provided at an intersecting point of the signal lines and comprising a gate electrode connected to the scanning signal line, a source electrode connected to the data signal line; and a pixel electrode electrically connected to a drain electrode of the thin film transistor.

In the active matrix substrate having the above constitution according to the present invention, the thin film transistor is driven and controlled by a current (gate signal) flowing in the scanning signal line, and the pixel electrode is driven and controlled by a current (data signal) flowing in the data signal line when the thin film transistor is in ON state.

In addition, according to the present invention, the data signal line has an at least partly multilinear structure. As the at least partly multilinear structure of the data signal line, there is a structure in which one signal line is partly divided to two or more lines, or a structure in which a path (wiring) for connecting crosses two or more data signal lines and the path (wiring) for connecting and the two or more data signal lines are connected with each other. When "or more" and "or less" are used in the present description, the value is included.

Furthermore, the active matrix substrate comprises a wiring structure having an overlapping part of a part of the wiring structure and the multilinear part of the data signal line, an overlapping part of a part of a wiring structure and a circuit part connecting the thin film transistor to the pixel electrode, and at least one of the overlapping parts provided through an insulating film. In addition, an elongated part (branched and projected part) is contained in the multilinear part of the data signal line and the circuit part connecting the thin film transistor to the pixel electrode. Before a point defect is corrected, since at least one of the overlapping parts of the wiring structure is provided through the insulation film, it is insulated so as not to generate a short circuit between the multilinear part of the data signal line and the circuit part connecting the thin film transistor to the pixel electrode. After the point defect is corrected, the short circuit is generated between the multilinear part of the data signal line and the circuit part connecting the thin film transistor to the pixel electrode by connecting them by laser irradiation and the like. The circuit part connecting the thin film transistor to the pixel electrode is preferably one of at least one conductive portion selected from a group consisting of the drain electrode of the thin film transistor, a drain extraction wiring and a storage capacitor upper electrode, and an elongated part of the conductive portion.

As the insulation film to insulate the overlapping part of the wiring structure, used may be a gate insulator, a protection film of a thin film transistor and the like. The thickness of the insulation film is not particularly limited, and 5000 Å or less is preferable in order to easily connect the overlapping part of the wiring structure by the laser irradiation and the like.

In addition, according to the present invention, there is provided an electrode which has a structure capable of connecting the multilinear part of the data signal line to the signal line and the electrode of an output (drain) side of the thin film transistor by a post-process when the pixel defect is corrected, that is, an interconnection electrode for correction as well as the above wiring structure. The configuration of the wiring structure or the interconnection electrode for correction is not particularly limited, and mentioned may be configuration of a rectangle, a triangle, a semi-circular, a trapezoid, and the like.

According to the active matrix substrate of the present invention, in the case where the pixel defect is generated because of a foreign material or a film remaining and the like in a manufacturing process of the active matrix substrate, the pixel in which the pixel defect is generated may be driven by forming an alternative path which electrically connects the pixel electrode of the pixel in which the pixel defect is generated to the pixel electrode of the adjacent pixel using the above wiring structure or the interconnection electrode for correction and by applying a voltage of substantially the same potential as that of the adjacent pixel to the pixel in which the pixel defect is generated. According to the present invention, since the data signal line comprises an at least partly multilinear structure, a part of the data signal line may be used in forming the alternative path, so that reduction of the aperture ratio is prevented. Since the active matrix substrate according to the present invention has an element structure in which the pixel defect may be corrected, when it is used in a substrate for a panel of the liquid crystal display device, a yield of the liquid crystal display device may be improved. Such active matrix substrate according to the present invention may be preferably used as a component of a panel for large liquid crystal TV especially requiring prevention of generation of a point defect.

The active matrix substrate of the present invention is not particularly limited, and may not include another component as long as the above components are provided and it is not particularly limited.

It is preferably that the interconnection electrode for correction partly overlaps with the data signal line through an insulation film, and partly overlaps with the data signal line through an insulation film. Thus, in the normal pixel, the interconnection electrode for correction and the data signal line, and the interconnection electrode for correction and one of the drain electrode and the drain extraction wiring are insulated through the insulation films, but when correction of the pixel defect is needed, the interconnection electrode for correction and the data signal line, and the interconnection electrode for correction and one of the drain electrode and the drain extraction wiring are respectively connected, by laser irradiation and the like to provide the interconnection electrode for correction used as the alternative path for correction of the pixel defect.

As the insulation film to insulate the interconnection electrode for correction from the data signal line, or the interconnection electrode for correction from one of the drain electrode and the drain extraction wiring, a gate insulator, a protection film of the thin film transistor and the like may be used. The thickness of the insulation film is not particularly limited, but 5000 Å or less is preferable in order to easily connect the interconnection electrode for correction by the laser irradiation and the like.

The wiring structure or the interconnection electrode for correction is preferably provided as a layer comprising the scanning signal line. Thus, the wiring structure or the interconnection electrode for correction may be easily formed without addition of a new step. In addition, the term "a layer comprising the scanning signal line" means a layer on which the scanning signal line is formed in the active matrix substrate comprising multi-layer structure. When the wiring structure or the interconnection electrode for correction and the scanning signal line are provided on the same layer, the wiring structure or the interconnection electrode for correction and the scanning signal line are formed at the same step. It is more preferable that the wiring structure or the interconnection electrode for correction is formed of the same conductive material and at the same step as those of the scanning signal line and the gate electrode of the thin film transistor in order to simplify its manufacturing steps and to reduce its manufacturing cost.

The active matrix substrate preferably comprises a storage capacitor wiring, and the wiring structure has a structure elongated from the storage capacitor wiring. Thus, since the wiring structure or the interconnection electrode for correction is not isolated in the shape of an island, concern about electrostatic discharge may be reduced.

In addition, the wiring structure or the interconnection electrode for correction partly overlaps with one of an electrode elongated from the drain extraction wiring and an electrode elongated from the storage capacitor upper electrode connected to the drain extraction wiring through the insulation film. Thus, the wiring structure or the interconnection electrode for correction elongated from the storage capacitor wiring constitutes a part of a storage capacitor element in the normal pixel and may function as the storage capacitor lower electrode. In addition, in order to simplify its manufacturing steps and reduce its manufacturing cost, the storage capacitor wiring is preferably formed of the same conductive material and at the same step as those of the scanning signal line and the gate electrode, and the storage capacitor upper electrode is preferably formed of the same conductive material and at the same step as those of the data signal line and the drain extraction wiring.

The active matrix substrate comprises two or more wiring structures or the interconnection electrodes for correction in one pixel. Thus, when the pixel defect is generated because of the break of the drain electrode or the drain extraction wiring, the alternative path may be formed in its own pixel and the pixel having the point defect may be driven like the normal pixel.

The pixel preferably comprises two or more sub-pixels and the sub-pixel comprises one or more wiring structures or interconnection electrodes for correction. Thus, when the point defect is generated in a certain sub-pixel, the alternative path may be formed in its own pixel by the laser irradiation and the like, and therefore the sub-pixel having the point defect may be driven like the normal sub-pixel by applying a voltage of the same potential from the adjacent sub-pixel to the sub-pixel having the point defect. The term "the pixel comprises two or more sub-pixels" means that the pixel is divided into two or more sub-pixels and the sub-pixels are respectively driven, that is, a multi-pixel structure is provided.

The wiring structure or the interconnection electrode for correction preferably overlaps with the data signal line through the insulation film, and with one of the drain electrode and the drain extraction wiring through the insulation film, respectively by 25 $\mu m^2$ or more. Thus, when the insulation film is melted by YAG (Yttrium Aluminum Garnet) laser and the like, a laser irradiation region is sufficiently provided, so that reliability in connecting the wiring structure or the interconnection electrode for correction to the data signal line, and the wiring structure or the interconnection electrode for correction to the drain electrode or the drain extraction wiring may be improved. In addition, in view of fluctuation in an overlapping region area because of an alignment shift at a photolithography step, a spread of an irradiation beam diameter of the YAG laser at the time of laser irradiation, and a configuration of film (taper) at a melting part of the wiring structure or the interconnection electrode (film) for correction, the data signal line or the drain extraction wiring after the laser irradiation, the overlapping region area is preferably increased at a certain degree, and more specifically, the overlapping region area is preferably 400 $\mu m^2$ or more.

In addition, the wiring structure or the interconnection electrode for correction preferably overlaps with the electrode such as the electrode elongated from the drain extraction wiring, and with the electrode elongated from the storage capacitor upper electrode through the insulation film, respectively by 25 $\mu m^2$ or more.

The wiring structure or the interconnection electrode for correction is preferably formed of a material comprising at least one kind selected from the group consisting of Al, Cr, Ta, Ti, W, Mo and Cu. Thus, the wiring structure or the interconnection electrode for correction is formed of a material comprising such metals having high melting point. Therefore, when the melting process is performed by the YAG laser and the like, the wiring structure or the interconnection electrode for correction may be connected to various kinds of electrodes or the various kinds of wirings easily and surely as compared with a transparent conductive film such as ITO.

The wiring structure or the interconnection electrode for correction preferably overlaps with one of a protrusion for controlling an alignment of a liquid crystal molecule and an electrode slit. The region in which the protrusion for controlling an alignment of a liquid crystal molecule or the electrode slit is formed in the opposed substrate or the active matrix substrate in the liquid crystal display device is a region which does not function as a transparent region (aperture part), and therefore, when the wiring structure or the interconnection electrode for correction is arranged so as to overlap with that region, prevented may be the reduction of aperture ratio caused by installation of the wiring structure or the interconnection electrode for correction. Therefore, the term "overlaps with one of a protrusion for controlling an alignment of a liquid crystal molecule and an electrode slit" means to overlap with one of the protrusion for controlling an alignment of a liquid crystal molecule and the electrode slit when the structure is seen from the vertical direction of the substrate (liquid crystal panel) surface, and a case where the protrusion for controlling an alignment of a liquid crystal molecule or the electrode slit is provided in the active matrix substrate of the present invention and a case where it is provided in the opposed substrate to the active matrix substrate of the present invention may be included. The active matrix substrate having the above constitution may be suitably used as a substrate for a liquid crystal panel of the MVA liquid crystal display device.

Examples of a more preferable configuration of the active matrix substrate of the present invention include the configuration the entire wiring structure or the entire interconnection electrode for correction is arranged in the region (non-transparent region) in which the protrusion for controlling an alignment or the electrode slit is formed. The protrusion for controlling an alignment is formed of a photosensitive resin and the like. Examples of a plan configuration of the protrusion for controlling an alignment and the electrode slit (when they are seen from the vertical direction of the substrate surface) include a strip-shaped configuration which is zig-zagged at a regular cycle.

The wiring structure or the interconnection electrode for correction is preferably elongated from a storage capacitor wiring and overlaps with the electrode slit. Since the wiring structure or the interconnection electrode for correction is formed under the electrode slit for controlling an alignment which does not contribute to the aperture ratio, the reduction of the aperture ratio because of the wiring structure or the interconnection electrode for correction is prevented. In addition, since the storage capacitor wiring is elongated to form the wiring structure or the interconnection electrode for correction, the fringe field effect because of the electrode slit may be improved.

Each component constituting the active matrix substrate of the present invention will, hereinafter, be described. Examples of materials of the substrate include a transparent insulation material and the like such as glass and plastic. Examples of materials of the signal lines (the scanning signal line and the data signal line), the gate electrode and the drain extraction wiring include a metal film of titanium (Ti), chrome (Cr), aluminum (Al), molybdenum (Mo), tantalum (Ta), tungsten (W), copper (Cu) and the like, their alloy film and their laminated film. Examples of methods for forming the signal line, the gate electrode and the drain extraction wiring include a method in which the above material is formed by sputtering and patterned by photo-etching.

Examples of materials of the source electrode and the drain electrode include an $n^+$ amorphous silicon and the like doped with phosphorus. Examples of methods of forming the source electrode and the drain electrode include a method in which the above material is formed by plasma CVD and the like and then the source and the drain are separately formed by dry etching and the like.

In addition, in order to simplify the manufacturing steps and to lower the manufacturing cost, the scanning signal line and the gate electrode, the data signal line and the drain extraction wiring, and the source electrode and the drain electrode are respectively formed of the same material and at the same step. The thickness of the signal line, the gate electrode and the drain extraction wiring is not particularly limited, but its lower limit is preferably 1000 Å and its upper limit is preferably 3000 Å. The thickness of the source electrode and the drain electrode is preferably about 500 Å.

Examples of materials of the pixel electrode include a transparent conductive material such as ITO, IZO, tin oxide, zinc oxide and the like. Examples of methods for forming the pixel electrode include a method in which the above material is formed by sputtering and the like and then patterned by photo-etching and the like. As a shape of the pixel electrode, a rectangle and the like may be mentioned. The thickness of the pixel electrode is not particularly limited, but its lower limit is preferably 1000 Å and its upper limit is preferably 2000 Å. The pixel electrode and the drain electrode or the drain extraction wiring are preferably connected by a contact hole and the like formed in the interlayer insulation film.

Examples of preferable configurations of the active matrix substrate of the present invention include a configuration in which (1) the substrate, (2) the scanning signal line, the gate electrode and a common capacitor wiring, (3) the (gate) insulation film, (4) the high-resistance semiconductor layer, (5) the data signal line, the source electrode, the drain electrode, the drain extraction wiring and a common capacitor upper electrode, (6) the interlayer insulation film (including the contact hole), and (7) the pixel electrode are laminated in this order from bottom.

In addition, the present invention provides a liquid crystal display device comprising the active matrix substrate. According to the liquid crystal display device of the present invention, when the pixel defect is generated in a manufacturing step of the active matrix substrate, a correction for the pixel defect may be easily and surely performed. Therefore, the pixel defect is sufficiently prevented and the liquid crystal display device may be provided with high quality and with a high yield. Such liquid crystal display device of the present invention may be suitably used in a large liquid crystal TV and the like especially requiring prevention of generation of a point defect.

Examples of preferable configurations of the liquid crystal display device of the present invention include a configuration in which the protrusion for controlling an alignment the liquid crystal molecule or the electrode slit is provided on the active matrix substrate and/or the opposed substrate. In this configuration, a wide viewing angle may be implemented.

The present invention also provides a method for correcting a pixel defect generated in the active matrix substrate, wherein a pixel electrode having a generated pixel defect is connected to one of adjacent pixel electrodes over one of the scanning signal line and the storage capacitor wiring through the wiring structure to be substantially the same potential. According to the method for correcting the pixel defect generated in an active matrix substrate of the present invention, the pixel in which the pixel defect is generated may be driven like the normal pixel by bringing the pixel electrode in which the pixel defect is generate to substantially the same potential as one of the pixel electrodes adjacent to that the pixel electrode over the scanning signal line or the storage capacitor wiring, so that the pixel defect may be corrected and the manufacturing yield of the active matrix substrate may be improved. Examples of the pixel defects include a short circuit between the source electrode and the drain electrode, and a luminance point, a black point and the like on a display screen caused by break of the drain electrode or the drain extraction wiring and TFT operation defect and the like. The term "substantially the same potential" is preferably the same potential as that of one of the adjacent electrodes, and the potential may be the range in which the pixel defect may be corrected.

The method for correcting the pixel defect in the active matrix substrate preferably comprises a step of connecting the data signal line to one of the drain extraction electrode and the storage capacitor upper electrode through the wiring structure or the interconnection electrode for correction. Thus, the alternative path comprising the above connected wiring structure or the interconnection electrode for correction, a part of the data signal line and the drain extraction wiring or the storage capacitor upper electrodes is formed to bring the pixel electrode of the pixel in which the pixel defect is generated to the same potential of one of the pixel electrodes adjacent to that pixel over the scanning signal line or the storage capacitor wiring, so that the pixel in which the pixel defect is generated can be driven like the normal pixel and the pixel defect may be corrected. As a result, the manufacturing yield of the active matrix substrate may be improved.

The connecting step is preferably performed by melting an overlapping region of the wiring structure or the interconnection electrode for correction and the data signal line, and an overlapping region of the wiring structure or the interconnection electrode for correction and one of the drain extraction electrode and the storage capacitor upper electrode by laser irradiation. Thus, as the insulation film or the like is melted by the above method, the data signal line may be easily and surely connected to the drain extraction electrode or the storage capacitor upper electrode through the wiring structure or the interconnection electrode for correction.

The laser beam used in melting is not particularly limited, but the second harmonic (wavelength is 532 nm) of the YAG laser may be mentioned, for example.

The method for correcting the pixel defect of the active matrix substrate preferably comprises a step of separating a part of the data signal line connected to the wiring structure or the interconnection electrode for correction. Thus, since a part of the data signal line connected to the wiring structure or the interconnection electrode for correction is separated as the alternative path, the data signal is not inputted to the part of the separated data signal line, so that the data signal of the data signal line is not applied to the alternative path, and the rest of the separated data signal line can function as the data signal line as it is. As a method for destroying and separating a part of the data signal line connected to the wiring structure or the interconnection electrode for correction, the laser irradiation and the like is preferable, and as the laser beam to be used, the fourth harmonic (wavelength is 266 nm) of the YAG laser may be mentioned, for example.

In the method for correcting the pixel defect in the active matrix substrate, a part of the data signal line connected to the wiring structure or the interconnection electrode for correction crosses the storage capacitor wiring. Thus, since a part of the data signal line to be used as the alternative path runs over the storage capacitor wiring, no additional parasitic capacity (so-called Cgd) generates when it runs over the scanning signal line, so that fluctuation $\Delta Vd$ in voltage applied to the pixel electrode may be prevented. In addition, the $\Delta Vd$ is an amount of voltage drop in proportion to Cgd. In addition, the term "a part of the data signal line connected to the wiring structure or the interconnection electrode for correction crosses the storage capacitor" means that a part of the data signal line connected to the wiring structure or the interconnection electrode for correction overlaps with the storage capacitor wiring.

The method for correcting the pixel defect in the active matrix substrate preferably comprises a step of separating a part of a data signal line connected to the pixel electrode having a generated pixel defect through a thin film transistor. Thus, the parasitic capacity (its own Csd) generated between its source signal line and the pixel electrode is fluctuated by separating a part of the data signal line (its source signal line) connected to the pixel electrode in which the pixel defect is generated through the thin film transistor so that the data signal is not inputted to that part of the data signal line, so that a fluctuated amount of a parasitic capacity (another Csd) generated between the next-stage (next-column) data signal line (another source signal line) whose one part is separated to be used as the alternative path may be canceled. Therefore, the fluctuation ΔVd of the voltage applied to the pixel electrode [ΔVd is influenced by the fluctuation of (its own Csd)–(another Csd) in the dot inversion driving] may be prevented. In addition, the method of separating the pixel electrode in which the pixel defect is generated from a part of the data signal line connected to the pixel through the thin film transistor is not particularly limited, but the laser irradiation is preferable.

In the method for correcting the pixel defect in the active matrix substrate, one of one part and a whole of an elongated part of the storage capacitor wiring is separated. Thus, since it is not necessary to additionally form the wiring structure or the interconnection electrode for correction on the active matrix substrate, the aperture ratio lowering because of the wiring structure or the interconnection electrode for correction may be prevented. In addition, in the normal pixel in which the pixel defect is not generated, the elongated part of the storage capacitor wiring may be used as a part of the storage capacitor element or in improving the fringe filed effect according to an original purpose.

According to the method for correcting the pixel defect in the active matrix substrate, one of the one part and the whole of the elongated part of the storage capacitor wiring is preferably separated so that an overlapping region of the wiring structure or the interconnection electrode for correction may be a minimum. Thus, since the wiring structure or the interconnection electrode for correction separated from (the elongated part of) the storage capacitor wiring is separated so that the region overlapping with the electrode slit may be the minimum area, and the reduced area of the elongated part of the storage capacitor wiring overlapping with the electrode slit may be a minimum. As a result, reduction of the fringe field effect because of the electrode slit may be minimum.

The present invention provides a manufacturing method of an active matrix substrate comprising a step of correcting a pixel defect by the method for correcting the pixel defect in the active matrix substrate. According to the manufacturing method of the active matrix substrate of the present invention, the active matrix substrate in which the pixel defect is sufficiently prevented may be manufactured.

Furthermore, the present invention provides a manufacturing method of a liquid crystal display device comprising a step of manufacturing the active matrix substrate by the method for correcting the pixel defect in the active matrix substrate. According to the manufacturing method of the liquid crystal display device of the present invention, the liquid crystal display device having high display quantity in which the pixel defect is sufficiently prevented may be manufactured and it may be manufactured with a high yield.

According to the active matrix substrate of the present invention, in the case where the pixel defect is generated because of a foreign material or a film remaining and the like in a manufacturing process of the active matrix substrate, the pixel in which the pixel defect is generated may be driven by forming an alternative path which electrically connects the pixel electrode of the pixel in which the pixel defect is generated to the pixel electrode of the adjacent pixel using the above wiring structure or the interconnection electrode for correction and applying a voltage of substantially the same potential as that of the adjacent pixel to the pixel in which the pixel defect is generated. According to the present invention, since the data signal line comprises an at least partly multilinear structure, a part of the data signal line may be used in forming the alternative path, so that reduction of an aperture ratio is prevented. When such active matrix substrate according to the present invention is used in a substrate for a panel of the liquid crystal display device, an yield of the liquid crystal display device may be improved and may be preferably used as a component of a panel for large liquid crystal TV especially requiring prevention of generation of a point.

BEST MODE FOR CARRYING OUT THE INVENTION

The present invention will be described in detail with reference to the drawings hereinafter, but the present invention is not limited to the embodiments only.

Embodiment 1

An embodiment 1 of the present invention will be described with reference to FIGS. 1 to 3. FIG. 1 is a schematic plan view showing a constitution of a pixel of an active matrix substrate according to the embodiment 1. As shown in FIG. 1, a plurality of the pixel electrodes 21 are provided on the active matrix substrate according to the embodiment 1 in the shape of a matrix. The scanning signal lines 22 and 22' to supply a scanning line signal and the data signal lines 23 and 23' to supply a data signal are provided so as to pass around the pixel electrodes 21 and intersect with each other. In addition, the data signal line 23' is formed in the next stage (next column) of the data signal line 23 and the data signal lines 23 and 23' are partly multilinear. The TFT 24 serving as a switching element to be connected to the pixel electrode 21 is provided at an intersecting part of the scanning signal lines 22 and 22' with the data signal lines 23 and 23'. The scanning signal lines 22 and 22' are connected to a gate electrode of the TFT 24 and the TFT 24 is driven and controlled by the scanning signal inputted to the gate electrode. In addition, the data signal lines 23 and 23' are connected to a source electrode of the TFT 24 and the data signal is inputted to the source electrode of the TFT 24. Furthermore, the drain extraction wiring 25 is connected to the drain electrode of the TFT 24 and the drain extraction wiring 25 is connected to the pixel electrode 21 through the contact hole 26. The interconnection electrode for correction 28 is formed in the pixel connected to the data signal line 23 so as to partly overlap with the drain extraction wiring 25 and the partly multilinear (adjacent or next-stage) data signal line 23'. Thus, according to this embodiment, the interconnection electrode for correction 28 has an overlapping part with the multilinear part of the data signal line 23 and an overlapping part with a circuit part (drain extraction wiring 25) between a thin film transistor and the pixel electrode.

Figure 2:
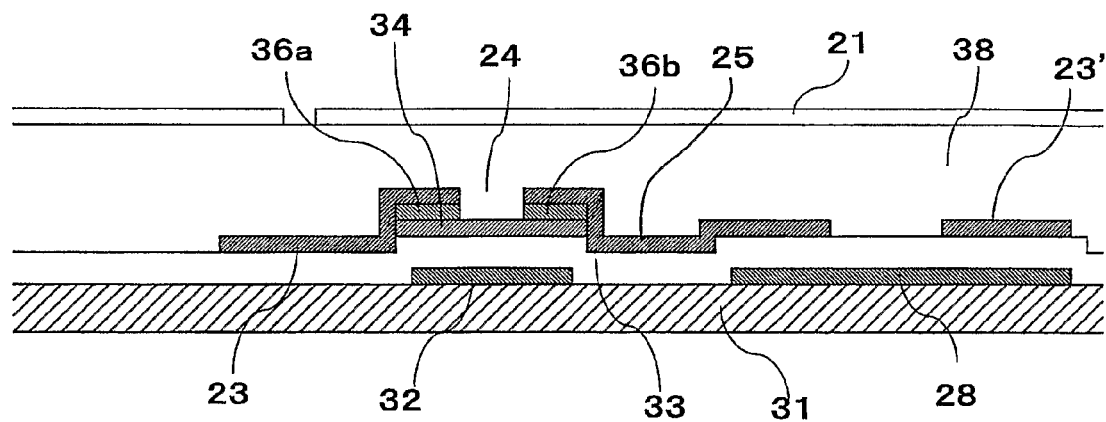
FIG. 2 is a schematic sectional view showing the active matrix substrate taken along line B-B' shown in FIG. 1 (before a pixel defect is corrected).

FIG. 2 is a schematic sectional view showing an active matrix substrate taken along line B-B' shown in FIG. 1.

As shown in FIG. 2, according to this embodiment, the gate electrode 32 connected to the scanning signal line 22 is provided on the transparent insulating substrate 31 such as glass, plastic and the like. The scanning signal line 22 and the gate electrode 32 are formed of a metal film of titanium, chrome, aluminum, molybdenum, tantalum, tungsten, copper or the like, their alloy film or their laminated film by sputtering so as to have a film thickness of 1000 to 3000 Å, and patterning the formed film into a required configuration by photo-etching. In addition, the interconnection electrode for correction 28 is formed by the same steps as that of the scanning signal line 22 and the gate electrode 32. Thus, the manufacturing steps may be simplified and its manufacturing cost may be reduced because of formation at the same step. The interconnection electrode for correction 28 is to be formed so as to overlap with the drain extraction wiring 25 and the data signal line 23' which will be formed on an upper layer thereof at the post-step.

In addition, according to this embodiment, the gate insulator 33 is provided so as to cover the scanning signal line 22, the gate electrode 32 and the interconnection electrode for correction 28. The gate insulator 33 is formed of an insulation film such as silicon nitride, silicon oxide or the like. Thereon is provided the high-resistance semiconductor layer 34 formed of amorphous silicon, polysilicon or the like so as to overlap the gate electrode 32, and a low-resistance semiconductor layer formed of $n^+$ amorphous silicon or the like doped with an impurity such as phosphorus is provided, which becomes the source electrode 36a and the drain electrode 36b as an ohmic contact layer. The gate insulator 33 formed of silicon nitride, silicon oxide or the like, the high-resistance semiconductor layer 34 such as amorphous silicon or the like, and the low-resistance semiconductor layer such as $n^+$ amorphous silicon or the like are formed by plasma CVD (Chemical Vapor Deposition) and the like and patterned by photo-etching and the like. The film thickness of the gate insulator 33 formed of silicon nitride is about 4000 Å, the film thickness of the high-resistance semiconductor layer 34 formed of amorphous silicon is about 1500 Å, and the film thickness of the low-resistance semiconductor layer formed of $n^+$ amorphous silicon is about 500 Å, for example.

According to this embodiment, the data signal lines 23 and 23' are formed so as to be connected to the source electrode 36a, the drain extraction wiring 25 is provided so as to be connected to the drain electrode 36b, and the drain extraction wiring 25 is connected to the pixel electrode 21 through the contact hole 26a (not shown in FIG. 2) which penetrates an interlayer insulation film 38. The data signal lines 23 and 23' and the drain extraction wiring 25 are formed by the same step. The data signal lines 23 and 23' and the drain extraction wiring 25 are formed of a metal film of titanium, chrome, aluminum, molybdenum, tantalum, tungsten, copper or the like, their alloy film or their laminated film by sputtering so as to have a film thickness of 1000 to 3000 Å, and patterning the formed film into a required configuration by photo-etching. The TFT 24 is formed by performing channel etching to the high-resistance semiconductor layer 34 such as the $n^+$ amorphous silicon film and the low-resistance semiconductor layer such as the amorphous silicon film by dry etching, using patterns of the data signal lines 23 and 23' and the drain extraction wiring 25 as a mask.

According to this embodiment, as the interlayer insulation film 38, a resin film of photosensitive acrylic resin and the like, an inorganic insulation film of silicon nitride, silicon oxide and the like, or their laminated film is provided. As the laminated film, used may be a laminated film of a silicon nitride film or a silicon oxide film (a protection film for the TFT 24) formed by the plasma CVD method and the like having thickness of 2000 Å and an organic insulation film (flatted film) such as a photosensitive acrylic resin film, polyimide resin film formed by a dye-coating method, a slit-coating method, a spin-coating method and the like having thickness of 30000 Å.

According to this embodiment, the contact hole 26 (not shown in FIG. 2) is formed so as to penetrate the interlayer insulation film 38 formed so as to cover upper parts of the TFT 24, the scanning signal lines 22 and 22', the data signal lines 23 and 23' and the drain extraction wiring 25. The contact hole 26 is formed by patterning the photosensitive acrylic resin by a photolithography method (exposure and development), and etching the interlayer insulation film 38 such as a silicon nitride film and the like by dry etching, using the patterned photosensitive acrylic resin as a mask, for example.

According to this embodiment, the pixel electrode 21 is formed on the interlayer insulation film 38, that is, it is provided by forming a conductive film having transparency such as ITO, IZO, zinc oxide, tin oxide and the like by sputtering and the like to be thickness of 1000 to 2000 Å and patterning the film to be a required configuration by photo-etching.

The active matrix substrate according to this embodiment is constituted by the above components.

Figure 3:
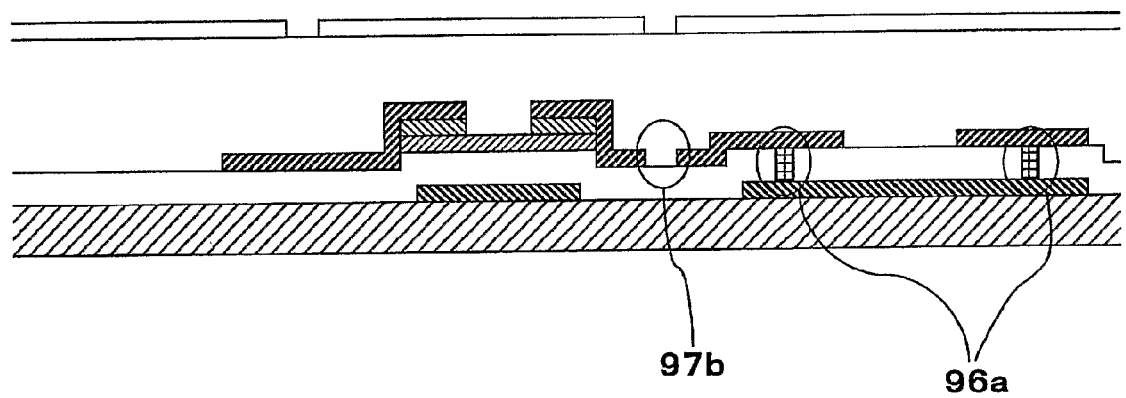
FIG. 3 is a schematic sectional view showing the active matrix substrate taken along line B-B' shown in FIG. 1 (after the pixel defect is corrected/after laser irradiation).

According to this embodiment, the interconnection electrode for correction 28 may connect the drain extraction wiring 25 to the (next-stage) data signal line 23' by irradiating the laser irradiation part 96a shown in FIG. 3 with YAG laser and the like. In addition, FIG. 3 is a schematic sectional view showing a state after correction of a pixel defect shown in FIG. 2.

Therefore, according to the active matrix substrate in this embodiment, when the film remaining defect 99 is generated in the TFT 24 and a short circuit between the source electrode and the drain electrode is generated, a normal voltage is not applied to the pixel electrode 21 and the pixel defect is generated, however, even in this case the pixel defect may be corrected, using the interconnection electrode for correction 28 and the partly multilinear (next-stage) data signal line 23' which are added constitution in the present invention, by a method for correcting a pixel defect as described below.

(1) First, in order to electrically separate the TFT 24 from the pixel electrode 21, the drain extraction wiring 25 is destructively separated by irradiating the laser irradiation part 97a of the drain extraction wiring 25 with laser from a front surface or the back surface of the substrate. As a laser wavelength, the fourth higher harmonic (wavelength is 266 nm) of the YAG laser may be used, for example.

(2) Then, a part of the (next-stage) data signal line 23' is separated from the data signal line 23' so that the data signal is not applied to the part of the (next-stage) data signal line 23'. Thus, the (next-stage) data signal line 23' is destructively separated by irradiating the laser irradiation part 97b of the (next-stage) data signal line 23' with the laser. As a laser wavelength, the fourth higher harmonic (wavelength is 266 nm) of the YAG laser may be used, for example.

(3) Then, the interconnection electrode for correction 28' is connected to the drain extraction wiring 25 in an adjacent normal pixel and to the (next-stage) data signal line 23' by irradiating the laser irradiation parts 96b in the adjacent normal pixel in which the pixel defect is not generated with the laser to melt the gate insulator 33. As a laser wavelength, the second higher harmonic (wavelength is 532 nm) of the YAG laser may be used, for example.

(4) Then, the interconnection electrode for correction 28 is connected to the drain extraction wiring 25 in the pixel in which the pixel defect is generated and to the (next-stage) data signal line 23' by irradiating the laser irradiation part 96a in the pixel in which the pixel defect is generated with the laser to melt the gate insulator 33. As a laser wavelength, the second higher harmonic (wavelength is 532 nm) of the YAG laser may be used, for example.

Since a voltage of the same potential as that of the pixel electrode of the adjacent normal pixel is applied to the pixel electrode of the pixel in which the pixel defect is generated through the new alternative path 95 in which the interconnection electrodes for correction 28 and 28' and a part of the (next-stage) data signal line 23' are used, by irradiating each part with the laser as described above (1) to (4), the pixel may be driven almost normally, so that the pixel defect may be corrected.

In addition, the pattern configuration of the interconnection electrodes for correction 28 and 28' is a rectangle as shown in FIG. 1 in this embodiment, but the pattern configuration of the interconnection electrodes for correction 28 and 28' is not limited to the above, and it may be a triangle, a semicircle, a trapezoid and the like. That is, it is preferable that the interconnection electrodes for correction 28 and 28' partly overlaps with the patterns of the drain extraction wiring 25 and the (next-stage) data signal line 23' through the gate insulator 33 and at least laser irradiation regions are ensured.

Figures 1, 4:
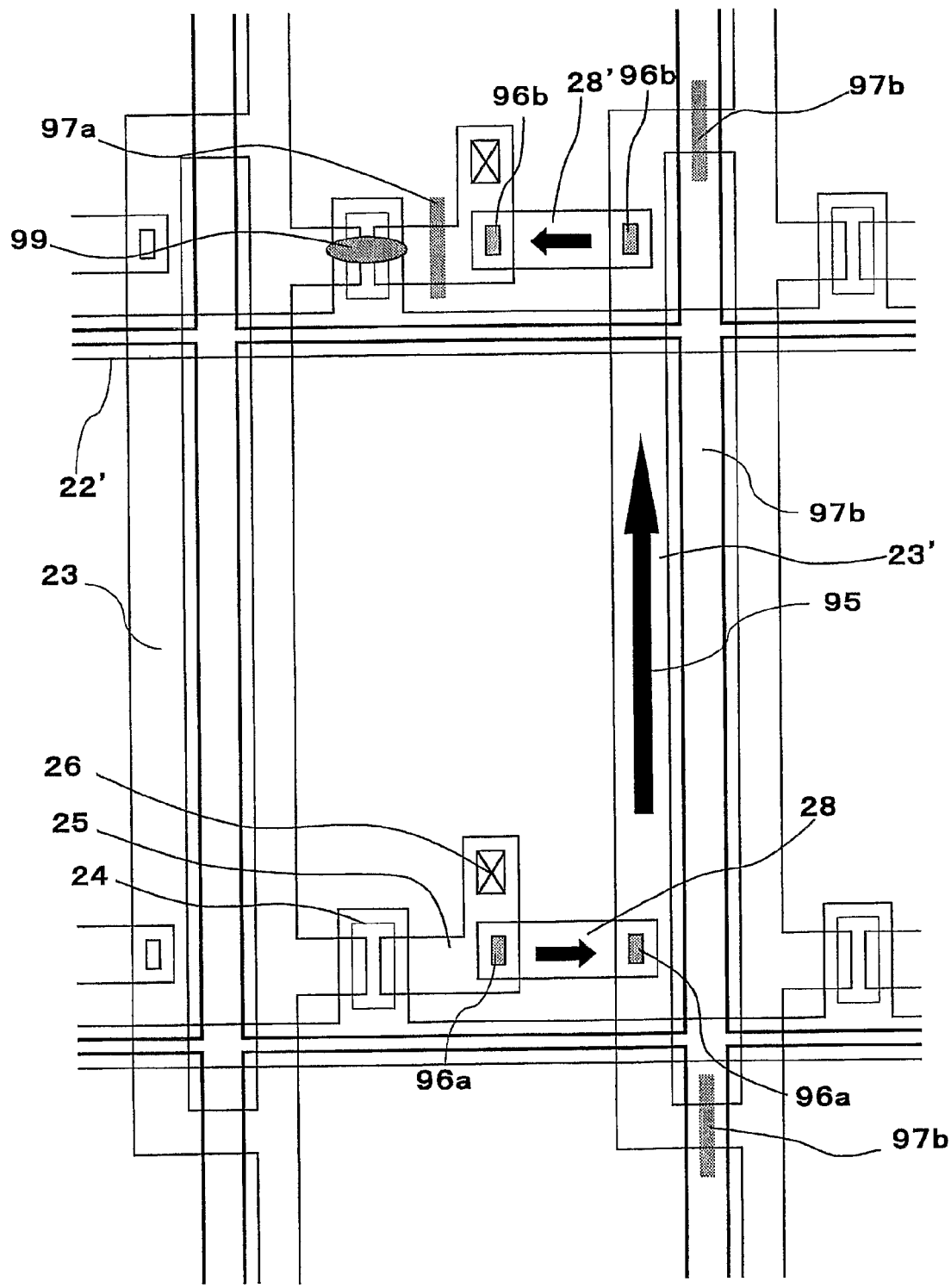
Figures 2, 4:
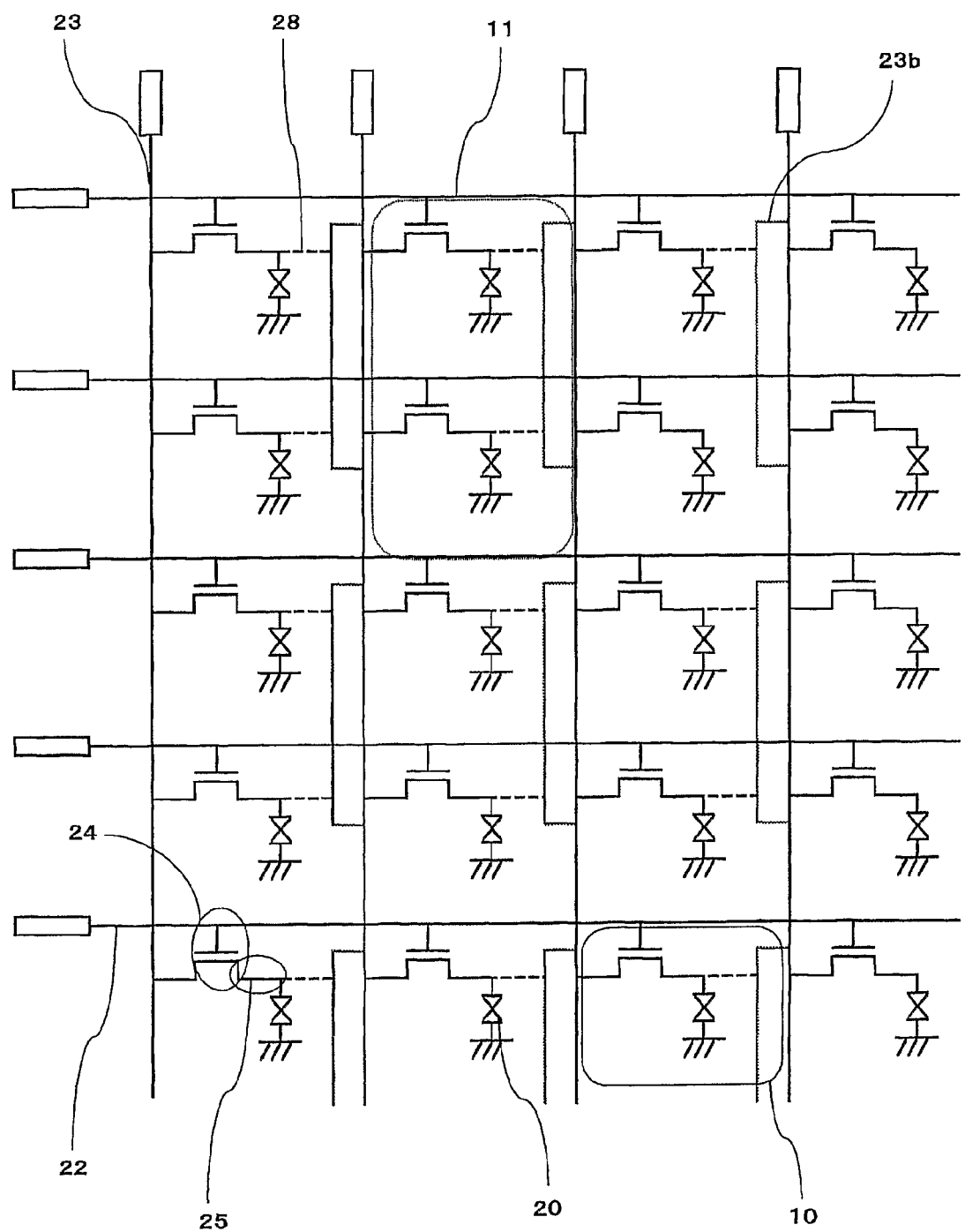

The wiring pattern in which the data signal lines 23 and 23' are multilinear and the multilines are partly connected is provided as shown in FIG. 1 according to this embodiment, but the wiring pattern of the data signal line is not limited to the above. The wiring pattern may be a single line except for the region which constitutes the alternative path 95 as shown in a variation in FIGS. 4-1 and a position of the connected part is not particularly limited. In addition, FIG. 4-2 shows a circuit constitution of the active matrix substrate shown in FIG. 4-1. As shown in FIG. 4-2, according to the active matrix substrate having a constitution shown in FIG. 4-1, a couple of picture elements 11 used for correction with each other is the repeating unit.

Figure 5:
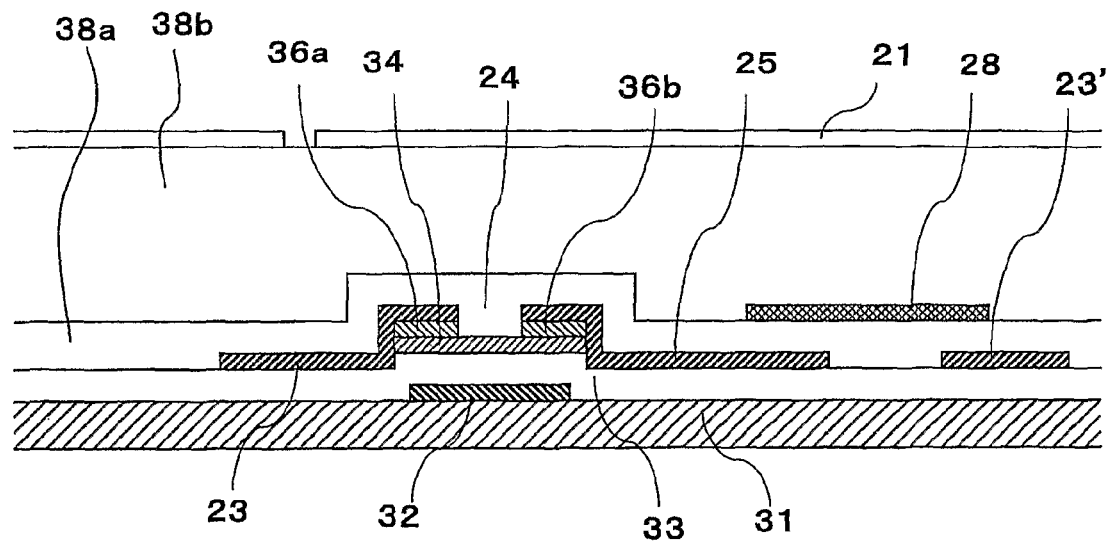
FIG. 5 is a schematic sectional view showing a variation of the active matrix substrate shown in FIG. 2 (before a pixel defect is corrected).
Figure 6:
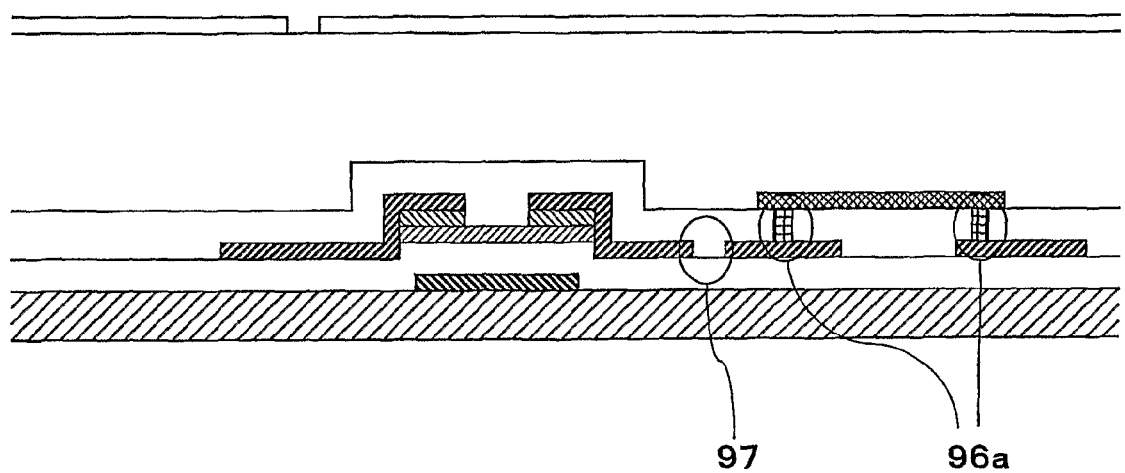
FIG. 6 is a schematic sectional view showing a variation of the active matrix substrate shown in FIG. 2 (after the pixel defect is corrected/after laser irradiation).

The interconnection electrode for correction 28 is provided in the same layer as that of the scanning signal line 22 and the gate electrode 32 as shown in FIG. 2 according to this embodiment, but it may be provided in a different layer. For example, as shown in a variation in FIG. 5, when the interlayer insulation film 38 comprises the protection film 38a and the flattened film 38b, the interconnection electrode for correction 28 may be provided between the protection film 38a and the flattened film 38b. In this case, the interconnection electrode for correction 28 may connect the drain extraction wiring 25 to the (next-stage) data signal line 23' by irradiating the laser irradiation parts 96a shown in FIG. 6 with the YAG laser and the like. In addition, FIG. 6 is a schematic sectional view showing a section after correction of the pixel defect shown in FIG. 5.

The pixel defect is corrected so that the alternative path 95 becomes the same potential as that of the (normal) pixel positioned above the pixel in which the pixel defect is generated as shown in FIG. 1 according to this embodiment, but the correction pattern of the pixel defect is not limited to the above, and the pixel defect may be corrected such that the pixel in which the pixel defect is generated becomes the same potential as that of a (normal) pixel positioned below the pixel in which the pixel defect is generated.

The pixel defect is corrected by irradiating the laser irradiation part with the laser in the order of (1) to (4) according to this embodiment, but the method for correcting a pixel defect is not limited to this order, and the laser irradiation may be performed in any order.

The pixel defect is corrected after the active matrix substrate is manufactured, that is, after the pixel electrode 21 is formed in this embodiment, but the correction timing of the pixel defect is not limited to the above, and the pixel electrode may be corrected in the middle of the manufacturing steps. According to this embodiment, the correction may be performed after the data signal lines 23 and 23' and the drain extraction wiring 25 are formed or after channel etching is performed.

Embodiment 2

Figure 7:
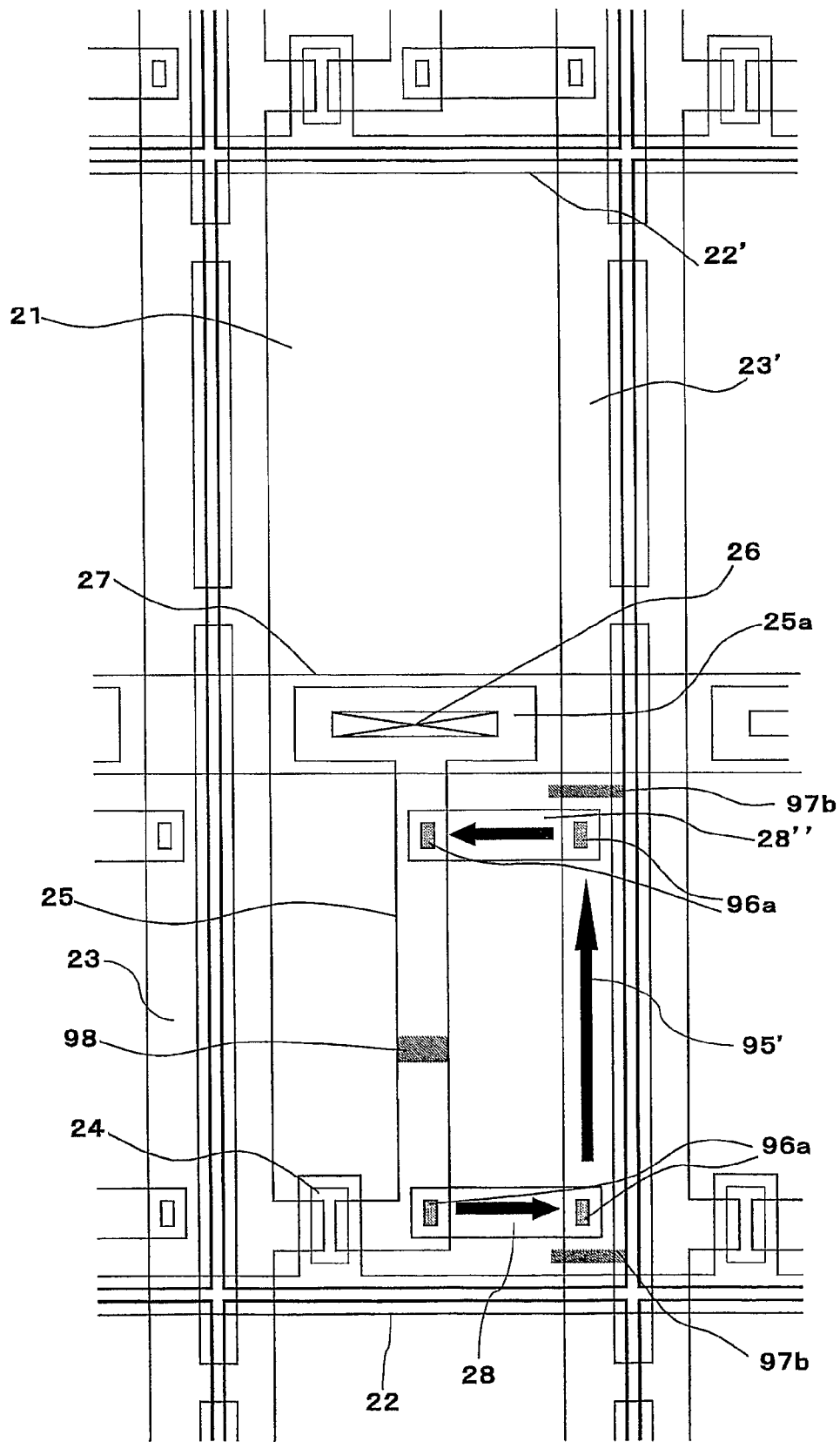
FIG. 7 is a schematic plan view showing a constitution of a pixel of an active matrix substrate according to an embodiment 2.

An embodiment 2 of the present invention will be described with reference to FIG. 7. FIG. 7 is a schematic plan view showing a constitution of a pixel of an active matrix substrate according to the embodiment 2. As shown in FIG. 7, a plurality of pixel electrodes 21 are provided on the active matrix substrate according to the embodiment 2 in a shape of a matrix. The scanning signal lines 22 and 22' to supply a scanning signal and the data signal lines 23 and 23' to supply a data signal are provided so as to pass around the pixel electrode 21 and intersect with each other. In addition, the data signal line 23' is formed in the next stage (next column) of the data signal line 23 and the data signal lines 23 and 23' are partly multilinear. The TFT 24 serving as a switching element to be connected to the pixel electrode 21 is provided at an intersecting part of the scanning signal lines 22 and 22' with the data signal lines 23 and 23'. The scanning signal lines 22 and 22' are connected to a gate electrode of the TFT 24 and the TFT 24 is driven and controlled by the scanning signal inputted to the gate electrode. In addition, the data signal lines 23 and 23' are connected to a source electrode of the TFT 24 and the data signal is inputted to the source electrode of the TFT 24. Furthermore, the drain extraction wiring 25 is connected to the drain electrode of the TFT 24 and the drain extraction wiring 25 is connected to the pixel electrode 21 through one electrode of the storage capacitor element (the storage capacitor upper electrode) 25a and the contact hole 26. The storage capacitor wiring 27 functions as the other electrode of the storage capacitor element (the storage capacitor lower electrode). Two interconnection electrodes for correction 28 and 28" are formed in the pixel connected to the data signal line 23 so as to partly overlap with the drain extraction wiring 25 and the partly multilinear (adjacent or next-stage) data signal line 23'.

In addition, since a description of members constituting the section of the active matrix substrate according to this embodiment is the same as in the embodiment 1, it is omitted.

According to the active matrix substrate in this embodiment, when the breaking defect (part) 98 is generated in the drain extraction wiring 25 in a certain pixel and the connection between the drain electrode and the pixel electrode 21 is cut off, a normal voltage is not applied to the pixel electrode 21 and the pixel defect is generated, however, even in this case, the pixel defect may be corrected, using the interconnection electrodes for correction 28 and 28" and the partly multilinear (next-stage) data signal line 23' which are added constitution in the present invention, by a method for correcting a pixel defect as described below.

(1) First, a part of the (next-stage) data signal line 23' is separated from the data signal line 23' so that the data signal is not applied to that part of the (next-stage) data signal line 23'. Thus, the (next-stage) data signal line 23' is destructively separated by irradiating the laser irradiation part 97b of the (next-stage) data signal line 23' with the laser. As a laser wavelength, the fourth higher harmonic (wavelength is 266 nm) of the YAG laser may be used, for example.

(2) Then, the interconnection electrode for correction 28 is connected to the drain extraction wiring 25 and to the (next-stage) data signal line 23', and the interconnection electrode for correction 28" is connected to the drain extraction wiring 25 and to the (next-stage) data signal line 23' by irradiating the laser irradiation parts 96a of the interconnection electrodes for correction 28 and 28" in the pixel in which the pixel defect is generated with the laser to melt the gate insulator 33. As a laser wavelength, the second higher harmonic (wavelength is 532 nm) of the YAG laser may be used, for example.

Since a normal voltage is applied from the TFT 24 in the pixel electrode to the pixel electrode of the pixel in which the pixel defect is generated through the new alternative path 95' in which the interconnection electrodes for correction and a part of the (next-stage) data signal line 23' are used, by irradiating each part with the laser as described above (1) and (2), the pixel may be driven almost normally, so that the pixel defect may be corrected.

In addition, the pattern configuration of the interconnection electrodes for correction 28 and 28'' is a rectangle as shown in FIG. 7 in this embodiment, but the pattern configuration of the interconnection electrodes for correction 28 and 28'' is not limited to the above, and it may be a triangle, a semicircle, a trapezoid and the like. That is, it is preferable that the interconnection electrodes for correction 28 and 28''' partly overlaps with the patterns of the drain extraction wiring 25 and the (next-stage) data signal line 23' through the gate insulator 33 and at least laser irradiation regions are secured.

Figure 8:
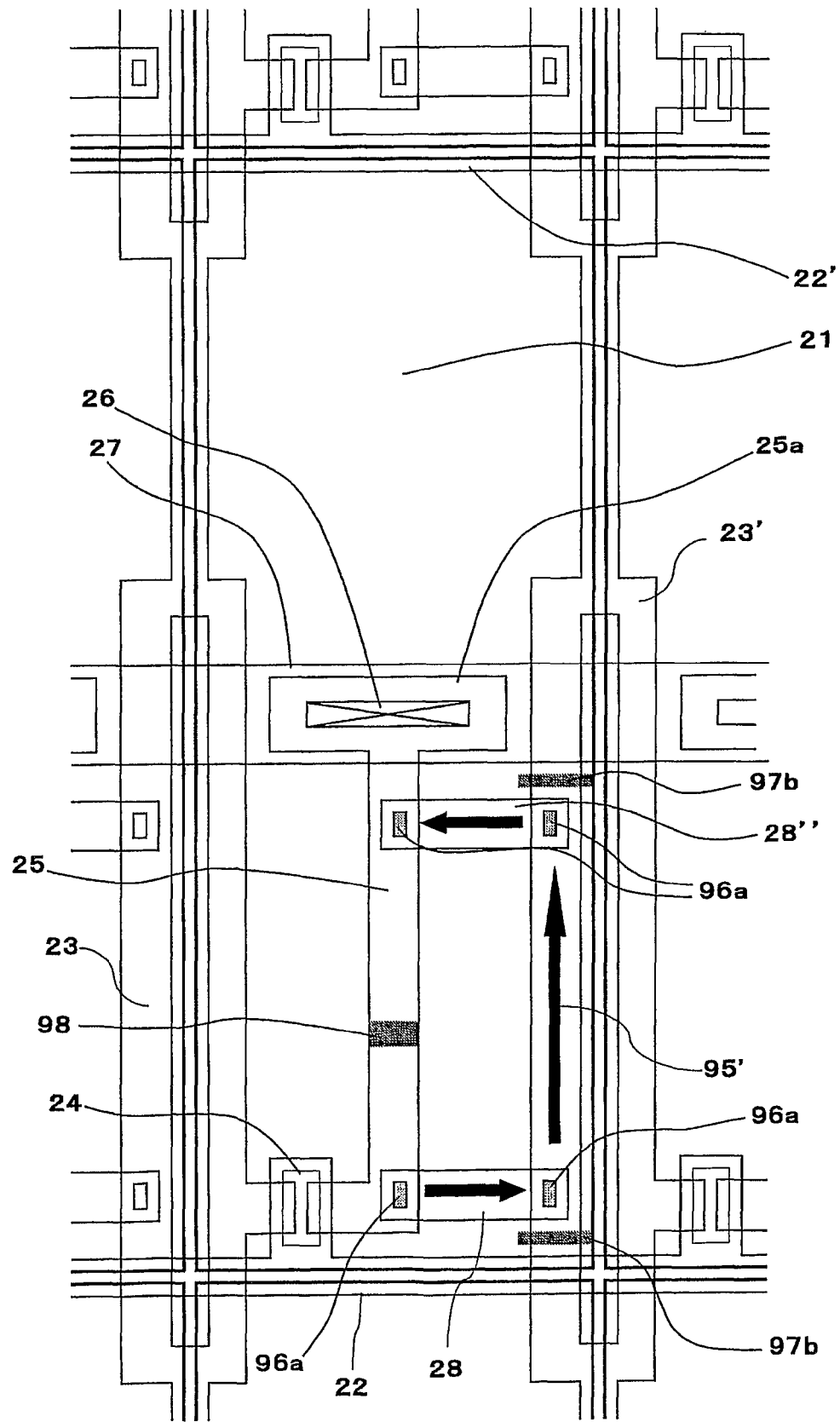
FIG. 8 is a schematic plan view showing a variation of the constitution of the pixel of the active matrix substrate shown in FIG. 7.

The wiring pattern in which the data signal lines 23 and 23' are multilinear and the multilines are partly connected is provided as shown in FIG. 7 according to this embodiment, but the wiring pattern of the data signal line is not limited to the above. The wiring pattern may be a single line except for the region which constitutes the alternative path 95 as shown in a variation in FIG. 8 and a position of the connected part is not particularly limited.

The pixel defect is corrected by irradiating the laser irradiation part with the laser in the order of (1) and (2) according to this embodiment, but the method for correcting a pixel defect is not limited to this order, and the laser irradiation may be performed in any order.

Embodiment 3

Figure 9:
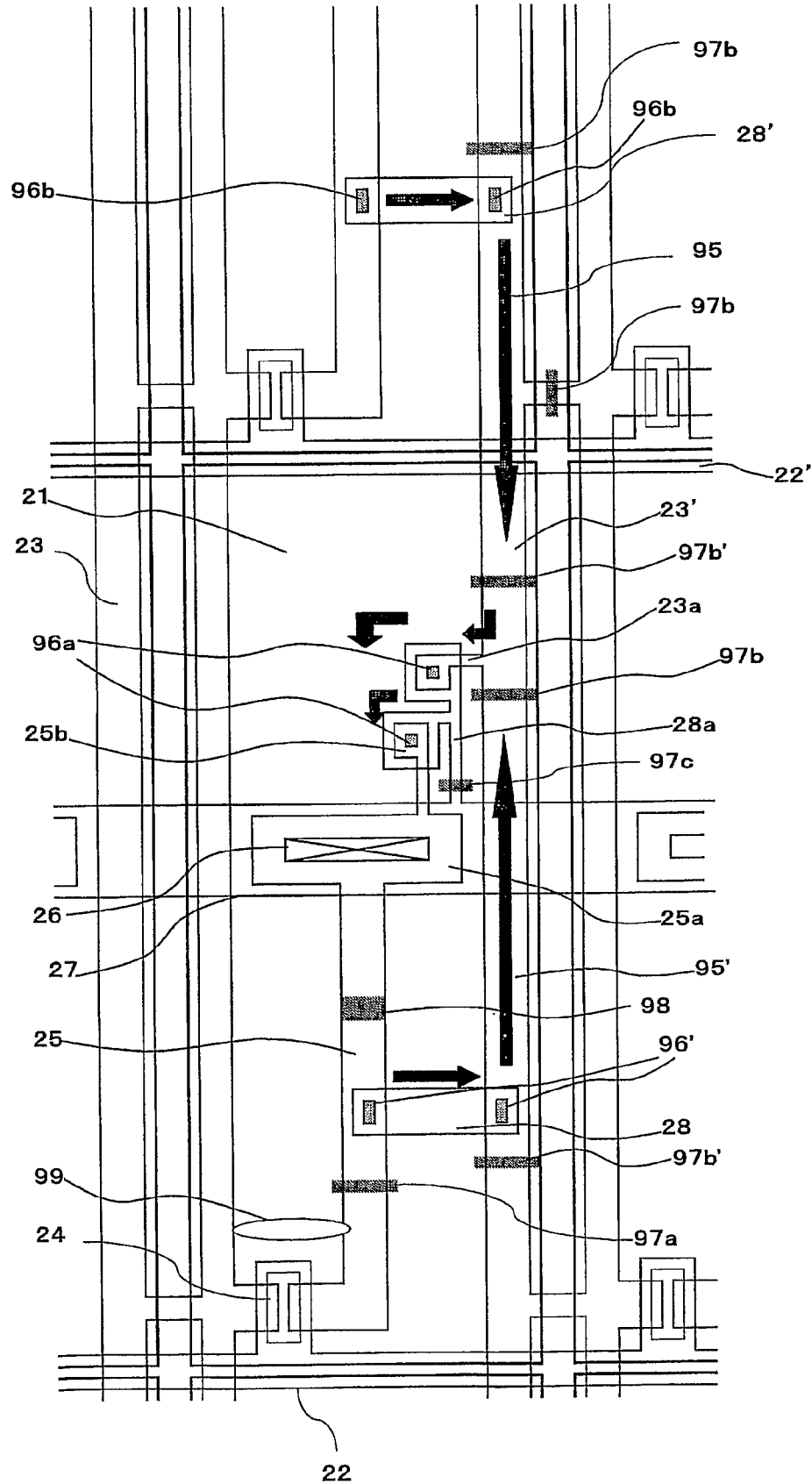
FIG. 9 is a schematic plan view showing a constitution of a pixel of an active matrix substrate according to an embodiment 3.

An embodiment 3 of the present invention will be described with reference to FIG. 9. FIG. 9 is a schematic plan view showing a constitution of a pixel of an active matrix substrate according to the embodiment 3. As shown in FIG. 9, a plurality of pixel electrodes 21 are provided on the active matrix substrate according to the embodiment 3 in the shape of a matrix. The scanning signal lines 22 and 22' to supply a scanning line signal and data signal lines 23 and 23' to supply a data signal are provided so as to pass around the pixel electrode 21 and intersect with each other. In addition, the data signal line 23' is formed in the next stage (next column) of the data signal line 23 and the data signal lines 23 and 23' are partly multilinear. The TFT 24 serving as a switching element to be connected to the pixel electrode 21 is provided at an intersecting part of the scanning signal lines 22 and 22' with the data signal lines 23 and 23'. The scanning signal lines 22 and 22' are connected to a gate electrode of the TFT 24 and the TFT 24 is driven and controlled by the scanning signal inputted to the gate electrode. In addition, the data signal lines 23 and 23' are connected to a source electrode of the TFT 24 and the data signal is inputted to the source electrode of the TFT 24. Furthermore, the drain extraction wiring 25 is connected to a drain electrode of the TFT 24 and the drain extraction wiring 25 is connected to the pixel electrode 21 through one electrode of the storage capacitor element (the storage capacitor upper electrode) 25a and the contact hole 26. The elongated part 25b of the storage capacitor upper electrode is connected to the storage capacitor upper electrode 25a. The storage capacitor wiring 27 functions as the other electrode of the storage capacitor element (the storage capacitor lower electrode). The interconnection electrode for correction 28a formed by elongating the storage capacitor wiring 27 overlaps with a part of the elongated part 25b of the storage capacitor upper electrode and the elongated part 23a of the data signal line. In addition, the interconnection electrode for correction 28 is formed in the pixel connected to the data signal line 23 so as to partly overlap with the drain extraction wiring 25 and the partly multilinear (adjacent or next-stage) data signal line 23'.

In addition, since a description of members constituting the section of the active matrix substrate according to this embodiment is the same as in the embodiment 1, it is omitted.

According to the active matrix substrate in this embodiment, when the film remaining defect (part) 99 is generated in a certain pixel and a short circuit is generated between the drain extraction wiring 25 and the data signal line 23, a normal voltage is not, applied to the pixel electrode 21 and the pixel defect is generated, however, even in this case the pixel defect may be corrected by a method for correcting a pixel defect as described below.

(1) First, in order to electrically separate the pixel electrode 21 from a part of the film remaining defect 99, the drain extraction wiring 25 is destructively separated by irradiating the laser irradiation part 97a of the drain extraction wiring 25 with the laser from a front surface or a back surface of the substrate. As a laser wavelength, the fourth higher harmonic (wavelength is 266 nm) of the YAG laser may be used, for example.

(2) Then, a part of the (next-stage) data signal line 23' is separated from the data signal line 23' so that the data signal is not applied to that part of the (next-stage) data signal line 23'. Thus, the (next-stage) data signal line 23' is destructively separated by irradiating the laser irradiation part 97b of the (next-stage) data signal line 23' with the laser. As a laser wavelength, the fourth higher harmonic (wavelength is 266 nm) of the YAG laser may be used, for example.

(3) Then, the interconnection electrode for correction 28' is connected to the drain extraction wiring 25 in an adjacent normal pixel and to the (next-stage) data signal line 23' by irradiating the laser irradiation parts 96b in the adjacent normal pixel in which the pixel defect is not generated with the laser to melt the gate insulator 33. As a laser wavelength, the second higher harmonic (wavelength is 532 nm) of the YAG laser may be used, for example.

(4) Then, the interconnection electrode for correction 28a is connected to the elongated part 25b of the storage capacitor upper electrode and to the elongated part 23a of the (next-stage) data signal line by irradiating the laser irradiation parts 96a in the pixel in which the pixel defect is generated with the laser to melt the gate insulator 33. As a laser wavelength the second higher harmonic (wavelength is 532 nm) of the YAG laser may be used, for example.

(5) Finally, the interconnection electrode for correction 28a is separated from the storage capacitor wiring 27 by irradiating the laser irradiation part 97c with the laser. As a laser wavelength, the fourth higher harmonic (wavelength is 266 nm) of the YAG laser may be used, for example.

Since a voltage of the same potential as that of the pixel electrode 21 of the adjacent normal pixel is applied to the pixel electrode of the pixel in which the pixel defect is generated through the new alternative path 95 in which a part of the interconnection electrodes for correction 28' or 28a, a part of the (next-stage) data signal line 23', the elongated part 23a of the data signal line and the elongated part 25b of the storage capacitor upper electrode are used, by irradiating each part with the laser as described above (1) to (5), the pixel may be driven almost normally, so that the pixel defect may be corrected.

In addition, the pattern configuration of the interconnection electrode for correction 28' is a rectangle as shown in FIG. 9 in this embodiment, but the pattern configuration of the interconnection electrode for correction 28' is not limited to the above, and it may be a triangle, a semicircle, a trapezoid and the like. That is, it is preferable that the interconnection electrode for correction 28' partly overlaps with the patterns of the drain extraction wiring 25 and the (next-stage) data signal line 23' through the gate insulator 33 and at least laser irradiation regions are ensured.

In addition, the pattern configurations of the elongated part 23a of the adjacent (next-stage) data signal line, the elongated part 25b of the storage capacitor upper electrode and the interconnection electrode for correction 28a elongated from the storage capacitor wiring are not limited to the illustrated pattern configurations in FIG. 9.

The pixel defect is corrected by irradiating the laser irradiation part with the laser in the order of (1) to (5) according to this embodiment, but the method for correcting a pixel defect is not limited to this order, and the laser irradiation may be performed in any order.

In addition, according to the active matrix substrate in this embodiment, when the breaking defect (part) 98 is generated and the drain extraction wiring 25 is broken, a normal voltage is not applied to the pixel electrode 21 and the pixel defect is generated, however, even in this case the pixel defect may be corrected by a method for correcting a pixel defect as described below.

(1) First, a part of the (next-stage) data signal line 23' is separated from the data signal line 23' so that the data signal is not applied to that part of the (next-stage) data signal line 23'. Thus, the (next-stage) data signal line 23' is destructively separated by irradiating the laser irradiation part 97b' of the (next-stage) data signal line 23' with the laser. As a laser wavelength, the fourth higher harmonic (wavelength is 266 nm) of the YAG laser may be used, for example.

(2) Then, the interconnection electrode for correction 28 is connected to the drain extraction wiring 25 and to the (next-stage) data signal line 23' by irradiating the laser irradiation part 96' of the pixel in which the pixel defect is generated with the laser to melt the gate insulator 33. As a laser wavelength, the second higher harmonic (wavelength is 532 nm) of the YAG laser may be used, for example.

(3) Then, the interconnection electrode for correction 28a is connected to the elongated part 25b of the storage capacitor upper electrode, and to the elongated part 23a of the (next-stage) data signal line by irradiating the laser irradiation part 96a of the pixel in which the pixel defect is generated with the laser to melt the gate insulator 33. As a laser wavelength, the second higher harmonic (wavelength is 532 nm) of the YAG laser may be used, for example.

(4) Finally, the interconnection electrode for correction 28a is separated from the storage capacitor wiring by irradiating the laser irradiation part 97c with the laser. As a laser wavelength, the fourth higher harmonic (wavelength is 266 nm) of the YAG laser may be used, for example.

Since a voltage of the same potential as that of the pixel electrode 21 of the adjacent normal pixel is applied to the pixel electrode of the pixel in which the pixel defect is generated from the TFT through the new alternative path 95' in which the interconnection electrodes for correction 28 and 28a, a part of the (next-stage) data signal line 23', the elongated part 23a of the data signal line and the elongated part 25b of the storage capacitor upper electrode are used, by irradiating each part with the laser as described above (1) to (4), the pixel may be driven almost normally, so that the pixel defect may be corrected.

Embodiment 4

Figure 10:
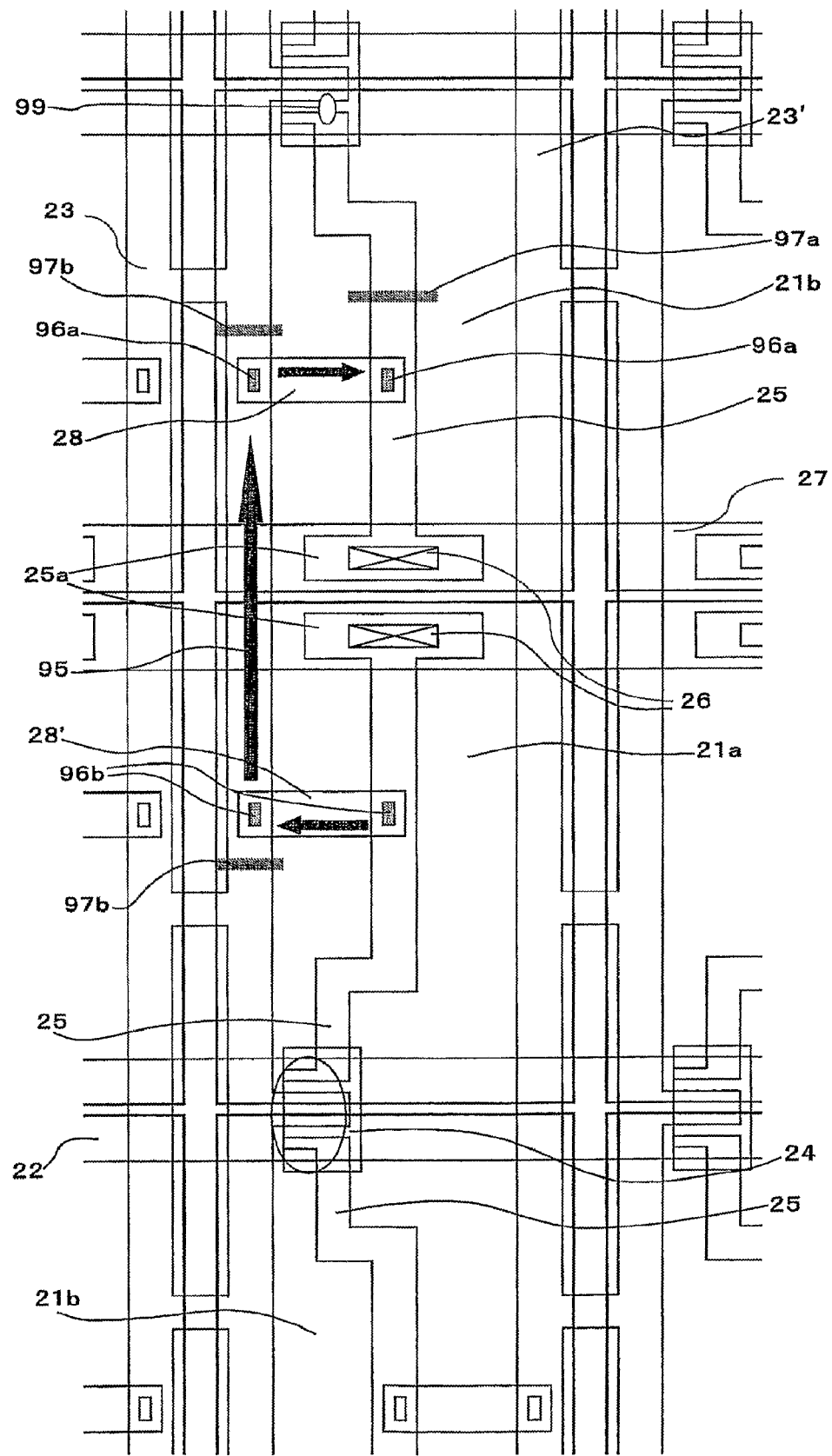
FIG. 10 is a schematic plan view showing a constitution of a pixel of an active matrix substrate according to an embodiment 4.

An embodiment 4 of the present invention will be described with reference to FIG. 10. FIG. 10 is a schematic plan view showing a constitution of a pixel of an active matrix substrate according to the embodiment 4. As shown in FIG. 10, according to the active matrix substrate in the embodiment 4, a pixel is divided into a plurality of sub-pixels and each of the sub-pixel electrodes 21a and 21b is driven and controlled by the TFT 24, which forms a so-called multi-pixel structure. The sub-pixels 21a and 21b are provided on the active matrix substrate in the shape of a matrix. The scanning signal line 22 to supply a scanning line signal and the data signal lines 23 and 23' to supply a data signal are provided so as to pass around the sub-pixels electrodes 21a and 21b and intersect with each other. In addition, the data signal line 23' is formed in the next stage (next column) of the data signal line 23 and the data signal lines 23 and 23' are partly multi-linear. The TFT 24 serving as a switching element to be connected to the sub-pixel electrodes 21a and 21b is provided at an intersecting part between the scanning signal line 22 and the data signal lines 23 and 23'. The TFT 24 has a structure of the TFT on GATE, and the scanning signal line 22 serves also as the gate electrode. The TFT 24 is driven and controlled by the scanning signal inputted to the scanning signal line 22. In addition, the data signal lines 23 and 23' are connected to a source electrode of the TFT 24 and a data signal is inputted to the source electrode of the TFT 24. Furthermore, the drain extraction wiring 25 is connected to the drain electrode of the TFT 24 and the drain extraction wiring 25 is connected to the sub-pixel electrodes 21a and 21b through one electrode of the storage capacitor element (a storage capacitor upper electrode) 25a and the contact hole 26. The storage capacitor wiring 27 functions as the other electrode of the storage capacitor element (the storage capacitor lower electrode). The interconnection electrode for correction 28 is formed so as to partly overlap with the drain extraction wiring 25 and the partly multilinear data signal line 23 (connected not to the next-stage one but to its own pixel through the TFT 24), in the pixel connected to the data signal line 23.

In addition, since a description of members constituting the section of the active matrix substrate according to this embodiment is the same as in the embodiment 1, it is omitted.

According to the active matrix substrate in this embodiment, when the film remaining defect 99 is generated in the TFT 24 and a short circuit is generated between the drain extraction wiring 25 and the data signal line 23 in a certain sub-pixel, a normal voltage is not applied to the sub-pixel electrode and the (sub-) pixel defect is generated, however, even in this case, the (sub-) pixel defect may be corrected by a method for correcting pixel defect a pixel defect as described below.

(1) First, in order to electrically separate the sub-pixel electrode 21b from the TFT 24, the drain extraction wiring 25 is destructively separated by irradiating the laser irradiation part 97a of the drain extraction wiring 25 with the laser from a front surface or the back surface of the substrate. As a laser wavelength, the fourth higher harmonic (wavelength is 266 nm) of the YAG laser may be used, for example.

(2) Then, a part of the data signal line 23 is separated from the data signal line 23 so that the data signal is not applied to that part of the data signal line 23. Thus, the data signal line 23 is destructively separated by irradiating the laser irradiation part 97b of the data signal line 23 with the laser. As a laser wavelength, the fourth higher harmonic (wavelength is 266 nm) of the YAG laser may be used, for example.

(3) Then, the interconnection electrode for correction 28' is connected to the drain extraction wiring 25 and to the data signal line 23 by irradiating the laser irradiation parts 96b in the adjacent normal (sub-) pixel in which the (sub-) pixel defect is not generated with the laser to melt the gate insulator 33. As a laser wavelength, the second higher harmonic (wavelength is 532 nm) of the YAG laser may be used, for example.

(4) Then, the interconnection electrode for correction 28 is connected to the data signal line 23 and to the drain extraction wiring 25 by irradiating the laser irradiation parts 96a in the (sub-) pixel in which the (sub-) pixel defect is generated with the laser to melt the gate insulator 33. As a laser wavelength, the second higher harmonic (wavelength is 532 nm) of the YAG laser may be used, for example.

Since a voltage of the same potential as that of the (sub-) pixel electrode 21a of the adjacent normal (sub-) pixel is applied to the (sub-) pixel electrode 21b of the pixel in which the (sub) pixel defect is generated through the new alternative path 95 in which the interconnection electrodes for correction 28 and 28' and a part of the data signal line 23 are used, by irradiating each part with the laser as described above (1) to (4), the pixel may be driven almost normally, so that the (sub-) pixel defect may be corrected.

In addition, the pattern configuration of the interconnection electrodes for correction 28 and 28' is a rectangle as shown in FIG. 10 in this embodiment, but the pattern configuration of the interconnection electrodes for correction 28 and 28' is not limited to the above, and it may be a triangle, a semicircle, a trapezoid and the like. That is, it is preferable that the interconnection electrodes for correction 28 and 28' partly overlaps with the patterns of the drain extraction wiring 25 and the data signal line 23 through the gate insulator 33 and at least laser irradiation regions are ensured.

Figure 11:
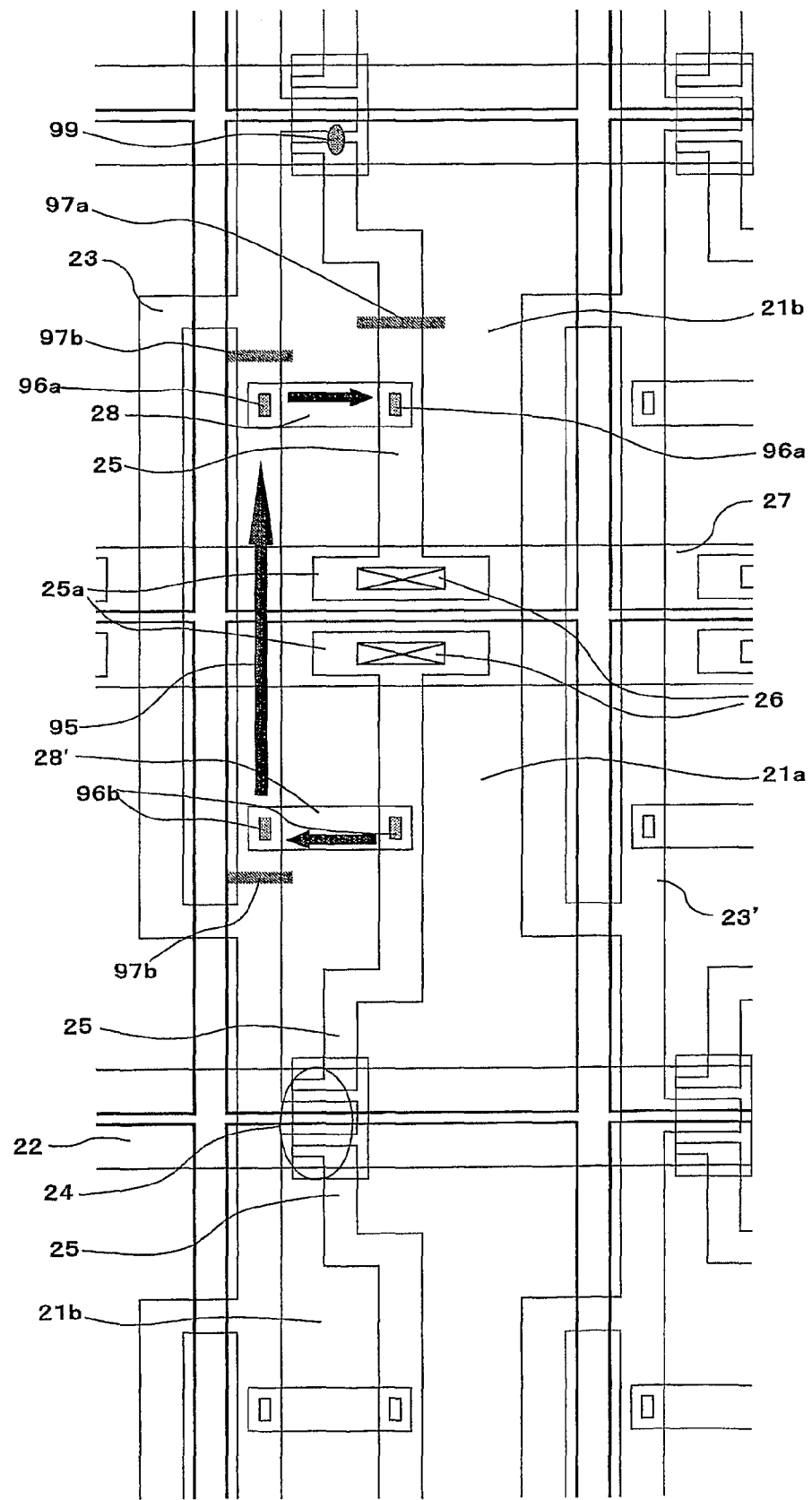
FIG. 11 is a schematic plan view showing a variation of the constitution of the pixel of the active matrix substrate shown in FIG. 10.

The wiring pattern in which data signal lines 23 and 23' are multilinear and the multilines are partly connected is provided as shown in FIG. 10 according to this embodiment, but the wiring pattern of the data signal line is not limited to the above, it may be a single line except for the region which constitutes the alternative path 95 as shown in a variation in FIG. 11 and a position of the connected part is not particularly limited.

The pixel defect is corrected by irradiating the laser irradiation part with the laser in the order of (1) to (4) according to this embodiment, but this method for correcting a pixel defect is not limited to this order, and the laser irradiation may be performed in any order.

A part of the interconnection electrode for correction 28 or 28' overlaps with the partly multilinear data signal line 23 (connected not to the next-stage pixel but to its own pixel through the TFT) in this embodiment, but the present invention is not limited to the above, and that part may be arranged so as to overlap with the (next-stage) data signal line 23'.

The alternative path 95 crosses the storage capacitor wiring 27, but the alternative path 95 is not limited, it may crosses the scanning signal line 22. The pixel defect may be corrected by connecting the normal pixel to adjacent (sub-) pixel even when the path crosses the scanning signal line 22, but parasitic capacity Cgd may be generated between the scanning signal line 22 and the alternative path 95 and a voltage value applied to the (sub) pixel may be largely fluctuated when the alternative path 95 crosses the scanning signal line 22. Therefore, the alternative path 95 crossing the storage capacitor wiring 27 may be used.

Embodiment 5

Figure 12:
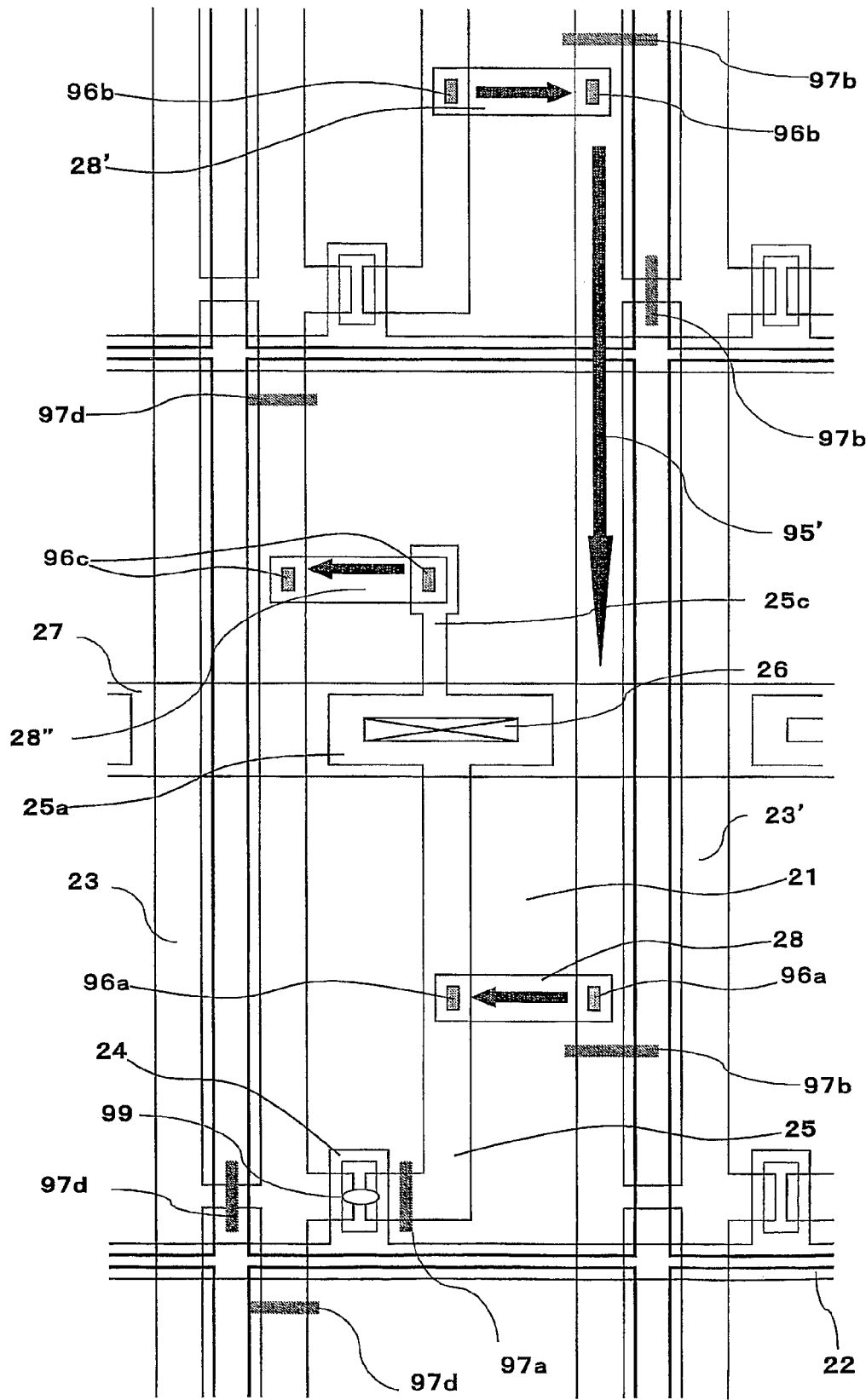
FIG. 12 is a schematic plan view showing a constitution of a pixel of an active matrix substrate according to an embodiment 5.

An embodiment 5 of the present invention will be described with reference to FIG. 12. FIG. 12 is a schematic plan view showing a constitution of a pixel of an active matrix substrate according to the embodiment 5. As shown in FIG. 12, a plurality of pixel electrodes 21 are provided on the active matrix substrate according to the embodiment 5 in the shape of a matrix. The scanning signal line 22 to supply a scanning line signal and the data signal lines 23 and 23' to supply a data signal are provided so as to pass around the pixel electrode 21 and intersect with each other. In addition, the data signal line 23' is formed in the next stage (next column) of the data signal line 23 and the data signal lines 23 and 23' are partly multilinear. The TFT 24 serving as a switching element to be connected to the pixel electrode 21 is provided at an intersecting part of the scanning signal line 22 and the data signal lines 23 and 23'. The scanning signal line 22 is connected to a gate electrode of the TFT 24 and the TFT 24 is driven and controlled by the scanning signal inputted to the gate electrode. In addition, the data signal lines 23 and 23' are connected to a source electrode of the TFT 24 and the data signal is inputted to the source electrode of the TFT 24. Furthermore, the drain extraction wiring 25 is connected to a drain electrode of the TFT 24 and the drain extraction wiring 25 is connected to the pixel electrode 21 through one electrode of the storage capacitor element (a storage capacitor upper electrode) 25a and the contact hole 26. The elongated part 25c of the storage capacitor upper electrode is connected to the storage capacitor upper electrode 25a. The storage capacitor wiring 27 functions as the other electrode of the storage capacitor element (the storage capacitor lower electrode). The interconnection electrodes for correction 28 and 28' are formed in the pixel connected to the data signal line 23 so as to partly overlap with the drain extraction wiring 25 and the partly multilinear (adjacent or next-stage) data signal line 23', and the interconnection electrode for correction 28" is formed so as to partly overlap with the elongated part 25c of the storage capacitor upper electrode and the partly multilinear data signal line 23 (connected not to the next-stage pixel but to its own pixel through the TFT).

In addition, since a description of members constituting the section of the active matrix substrate according to this embodiment is the same as in the embodiment 1, it is omitted.

According to the active matrix substrate in this embodiment, when the film remaining defect (part) 99 is generated in a certain pixel and a short circuit is generated between the drain extraction wiring 25 and the data signal line 23, a normal voltage is not applied to the pixel electrode 21 and the pixel defect is generated, however, even in this case, the pixel defect may be corrected by a method for correcting a pixel defect as described below.

(1) First, in order to electrically separate the pixel electrode 21 from a part of the film remaining defect 99, the drain extraction wiring 25 is destructively separated by irradiating the laser irradiation part 97a of the drain extraction wiring 25 with the laser from a front surface or a back surface of the substrate. As a laser wavelength, the fourth higher harmonic (wavelength is 266 nm) of the YAG laser may be used, for example.

(2) Then, a part of the (next-stage) data signal line 23' is separated from the data signal line 23' so that the data signal is not applied to that part of the (next-stage) data signal line 23'. Thus, the (next-stage) data signal line 23' is destructively separated by irradiating the laser irradiation part 97b of the (next-stage) data signal line 23' with the laser. As a laser wavelength, the fourth higher harmonic (wavelength is 266 nm) of the YAG laser may be used, for example.

(3) Then, the interconnection electrode for correction 28' is connected to the drain extraction wiring 25 and to the (next-stage) data signal line 23' by irradiating the laser irradiation parts 96b in the adjacent normal pixel in which the pixel defect is not generated with the laser to melt the gate insulator 33. As a laser wavelength, the second higher harmonic (wavelength is 532 nm) of the YAG laser may be used, for example.

(4) Then, the interconnection electrode for correction 28 is connected to the drain extraction wiring 25 and to the (next-stage) data signal line 23' by irradiating the laser irradiation parts 96a in the pixel in which the pixel defect is generated with the laser to melt the gate insulator 33. As a laser wavelength, the second higher harmonic (wavelength is 532 nm) of the YAG laser may be used, for example.

(5) Then, a part of the data signal line 23 is separated from the data signal line 23 so that the data signal is not applied to that part of the data signal line 23 (connected not to the next-stage pixel but to its own pixel through the TFT 24). Thus, the data signal line 23 is destructively separated by irradiating the laser irradiation part 97d with the laser. As a laser wavelength, the fourth higher harmonic (wavelength is 266 nm) of the YAG laser may be used, for example.

(6) Finally, the interconnection electrode for correction 28" is connected to the elongated part 25c of the storage capacitor upper electrode and to the data signal line 23 by irradiating the laser irradiation parts 96c with the laser to melt the gate insulator 33. As a laser wavelength, the second higher harmonic (wavelength is 532 nm) of the YAG laser may be used, for example.

Since a voltage of the same potential as that of the pixel electrode 21 of the adjacent normal pixel is applied to the pixel electrode 21 of the pixel in which the pixel defect is generated through the new alternative path 95' in which the interconnection electrodes for correction 28, 28' and 28", a part of the (next-stage) data signal line 23', and the elongated part 25c of the storage capacitor upper electrode are used, by irradiating each part with the laser as described above (1) to (6), the pixel may be driven almost normally, so that the pixel defect may be corrected.

According to this embodiment, a fluctuation amount of the capacity component Csd2 between the (adjacent) data signal line 23' and the pixel electrode 21 which is generated when a part of the (adjacent) data signal line 23' is destructively separated at the time of correcting the pixel defect may be balanced by fluctuating the capacity component Csd1 between the data signal line 23 which drives an object pixel and the pixel electrode 21 by destructively separating a part of the data signal line 23.

The above will be described in detail by illustrating dot inversion driving. A pixel capacity is represented with Clc, a capacity of the storage capacitor element is represented with Ccs, a parasitic capacity between the scanning signal line 22 and the pixel electrode 21 is represented with Cgd, and a parasitic capacity between the data signal lines 23 and 23' and the pixel is represented with Csd. In addition, Cpix is defined as a sum of Clc, Ccs, Cgd, and Csd (Cpix=Clc+Ccs+Cgd+Csd). In addition, $\beta$ represents $\beta$=Csd/Cpix.

According to a dot inversion driving method, Csd is divided into the capacity component Csd1 in the data signal line 23 (which drives the object pixel) and the capacity Csd2 in the (next-stage) data signal line 23' which drives the next-stage pixel. In addition, a data signal amplitude is represented with Vspp. In addition, $\Delta\beta$ is defined as $\Delta\beta$=(Csd1−Csd2)/Cpix. At this time, the effective value of a pixel potential Vd after charging the pixel at a source voltage Vs is such that Vd≈Vs−Vspp×$\Delta\beta$/2.

Therefore, when the value $\Delta\beta$ is fluctuated because of the correction of the pixel defect, Vd is changed, and therefore display is performed by a tone which is different from that of the normal pixel, so that there is a case the pixel defect may not be perfectly corrected.

According to this embodiment, a fluctuation amount of the capacity component Csd2 between the (adjacent) data signal line 23' and the pixel electrode 21, which is generated when a part of the (adjacent) data signal line 23' is destructively separated at the time of correcting the pixel defect with may be negated by fluctuating fluctuation amount of the capacity component Csd1 between the data signal line 23 which drives the object pixel and the pixel electrode 21 by destructively separating a part of the data signal line 23. Therefore, the value $\Delta\beta$ may be prevented from being fluctuated.

In addition, the pattern configuration of the interconnection electrodes for correction 28, 28' and 28" is a rectangle as shown in FIG. 12 in this embodiment, but the pattern configuration of the interconnection electrodes for correction 28, 28' and 28" is not limited to the above, and it may be a triangle, a semicircle, a trapezoid and the like. That is, it is preferable that the interconnection electrodes for correction 28 and 28" partly overlap with the patterns of the drain extraction wiring 25 and the (next-stage) data signal line 23' through the gate insulator 33, a part of the interconnection electrode for correction 28" overlaps with the pattern of the elongated part 25c of the storage capacitor upper electrode or the data signal line 23, and at least laser irradiation regions are ensured.

In addition, the pattern configuration of the elongated part 25c of the storage capacitor upper electrode is not limited to the illustrated pattern configuration shown in FIG. 12.

In addition, the pixel defect is corrected by irradiating the laser irradiation part with the laser in the order of (1) to (6) according to this embodiment, but the method for correcting a pixel defect is not limited to this order, and the laser irradiation may be performed in any order.

Embodiment 6

Figure 13:
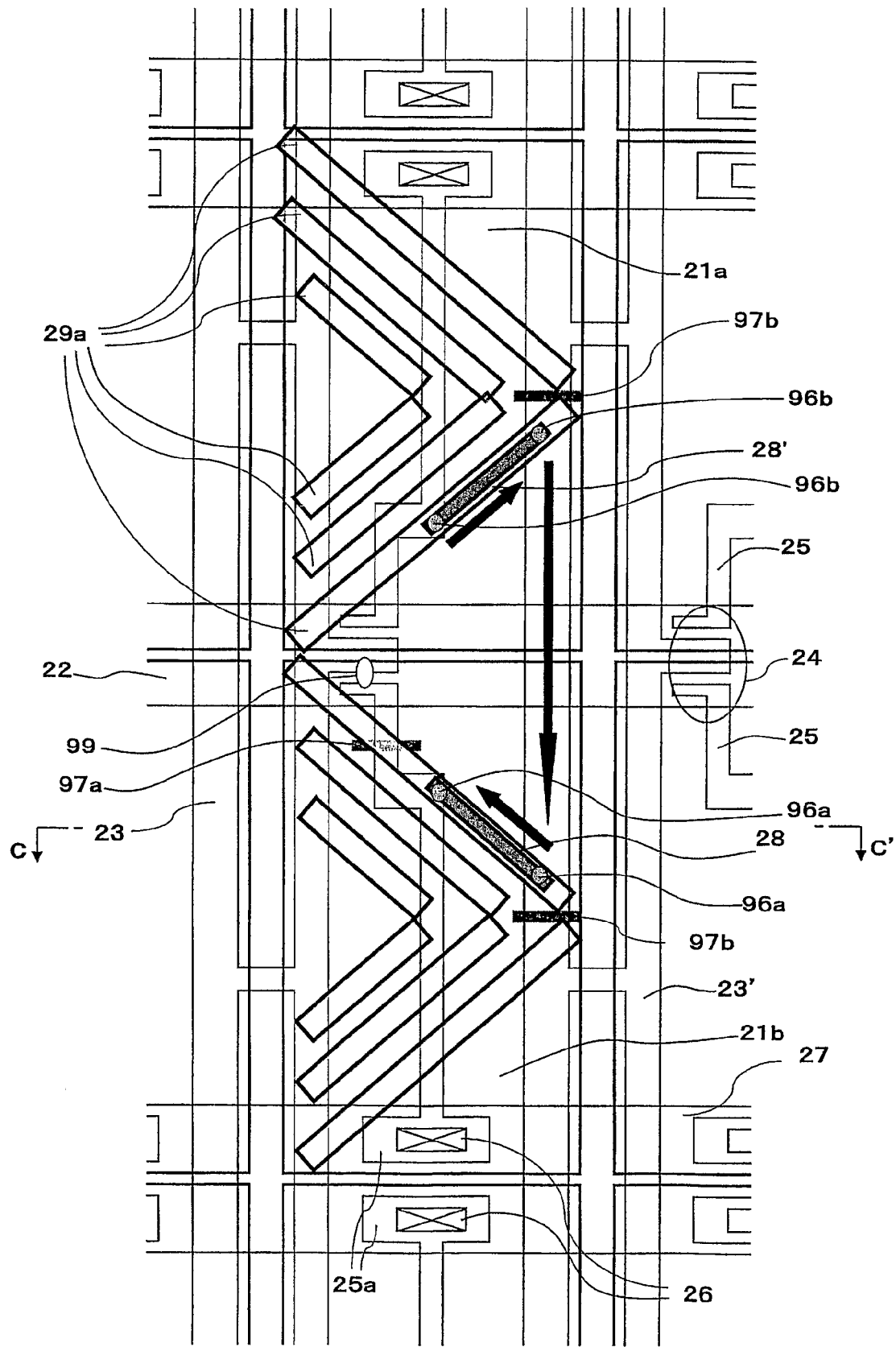
FIG. 13 is a schematic plan view showing a constitution of a pixel of an active matrix substrate according to an embodiment 6.
Figure 14:
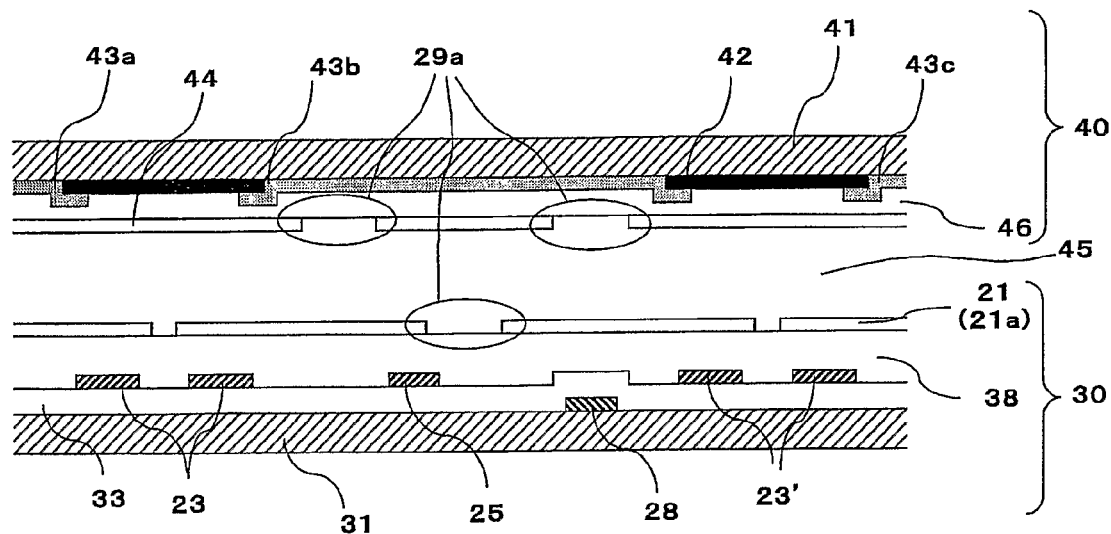
FIG. 14 is a schematic sectional view showing an example of the active matrix substrate taken along line C-C' shown in FIG. 13.
Figure 15:
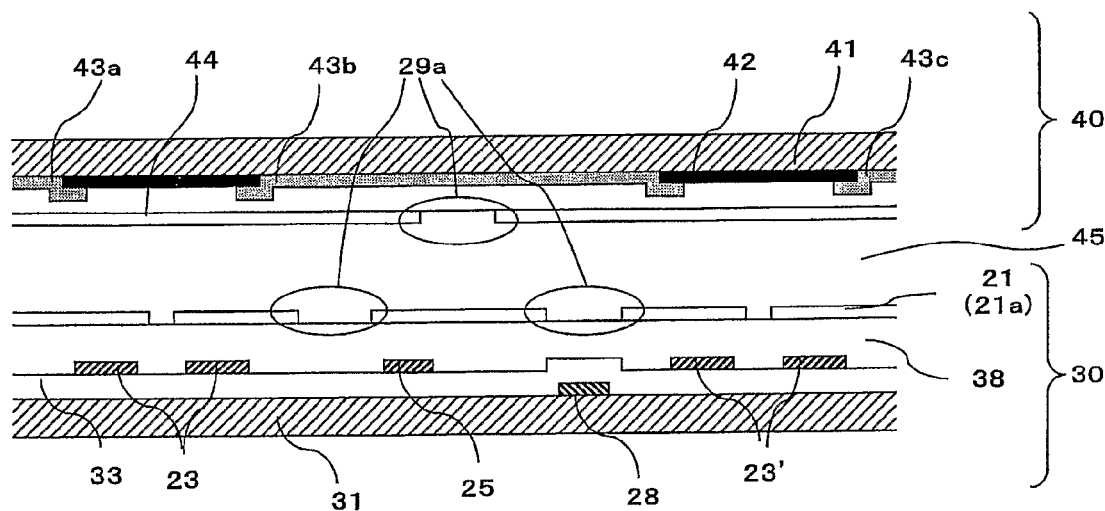
FIG. 15 is a schematic sectional view showing another example of the active matrix substrate taken along line C-C' shown in FIG. 13.

An embodiment 6 of the present invention will be described with reference to FIGS. 13 to 15. FIG. 13 is a schematic plan view showing a constitution of a pixel of an active matrix substrate according to the embodiment 6. FIGS. 14 and 15 are schematic sectional views showing an example of a section of the active matrix substrate taken along line C-C' shown in FIG. 13.

According to the present invention, as shown in FIG. 13, the interconnection electrodes for correction 28 and 28' may be formed by arranging the interconnection electrodes for correction 28 and 28' so as to overlap with the pixel electrode slit 29a of the active matrix substrate or the opposed electrode slit 29a of an opposed substrate, without reducing an aperture ratio.

The pixel electrode slit 29a of the active matrix substrate and the opposed electrode slit 29a of the opposed substrate are electrode patterns to control liquid crystal alignment, which is formed on the substrate in an MVA vertical aligned liquid crystal display device used in a large liquid crystal TV and the like.

The vertically aligned (active matrix) liquid crystal display device comprises a pair of the color filter substrate (opposed substrate) 40 and the active matrix substrate 30, which face with each other. The color filter substrate 40 has the colored layers 43 (43a, 43b and 43c), the opposed electrode 44 and an orientation film (not shown) on the transparent substrate 41. In addition, the overcoat layer 46 may be provided according to need. The pair of substrates, that is, the color filter substrate 30 and the active matrix substrate 40 are spaced at a regular interval by a spacer (not shown) formed of glass fiber or plastic beads and a projecting laminated layer (not shown) for holding a cell gap, and bonded by a sealing material (not shown) in such a manner that their orientation films are faced. The liquid crystal (layer) 45 is charged between the pair of substrates and a inlet of liquid crystal is sealed by a sealing material (not shown).

In addition, the pattern configuration of the interconnection electrodes for correction 28 and 28' is a rectangle as shown in FIG. 13 in this embodiment, but the pattern configuration of the interconnection electrodes for correction 28 and 28' is not limited to the above, and it may be a triangle, a semicircle, a trapezoid and the like. That is, it is preferable that the interconnection electrodes for correction 28 and 28' partly overlap with the patterns of the drain extraction wiring 25 and the (next-stage) data signal line 23' through the gate insulator 33, and they are partly in a region of the pixel electrode slit 29*a* of the active matrix substrate or the opposed electrode slit 29*a* of the opposed substrate.

The configuration of the pixel electrode slit 29*a* of the active matrix substrate or the opposed electrode slit 29*a* of the opposed substrate is a rectangle as shown in FIG. 13 according to this embodiment, but the pattern configuration of pixel electrode slit 29*a* of the active matrix substrate or the opposed electrode slit 29*a* of the opposed substrate is not limited to the above, and it is preferable that it may be formed so that a desired viewing angle and visual characteristics may be obtained.

Embodiment 7

Figure 16:
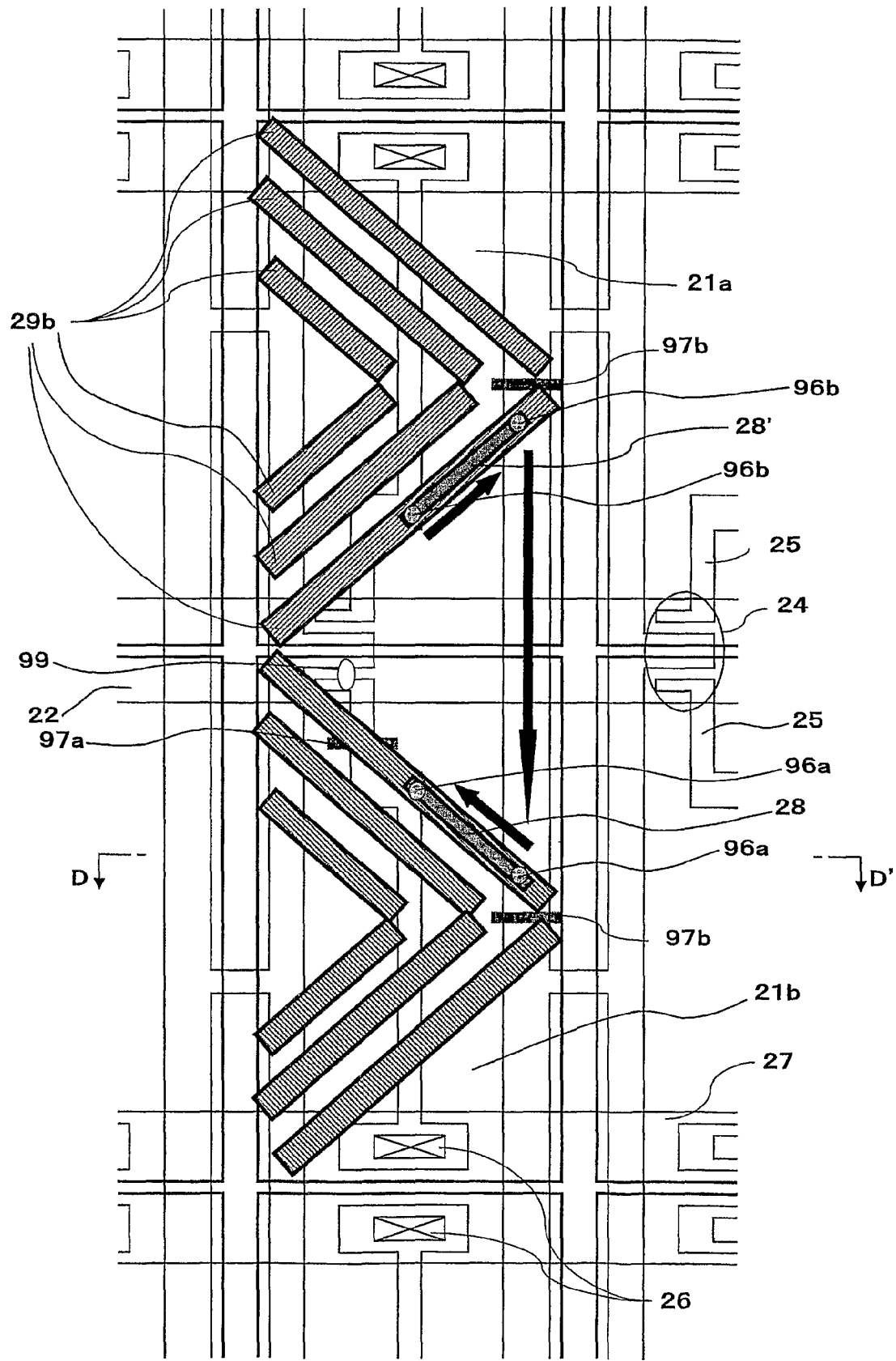
FIG. 16 is a schematic plan view showing a constitution of a pixel of an active matrix substrate according to an embodiment 7.
Figure 17:
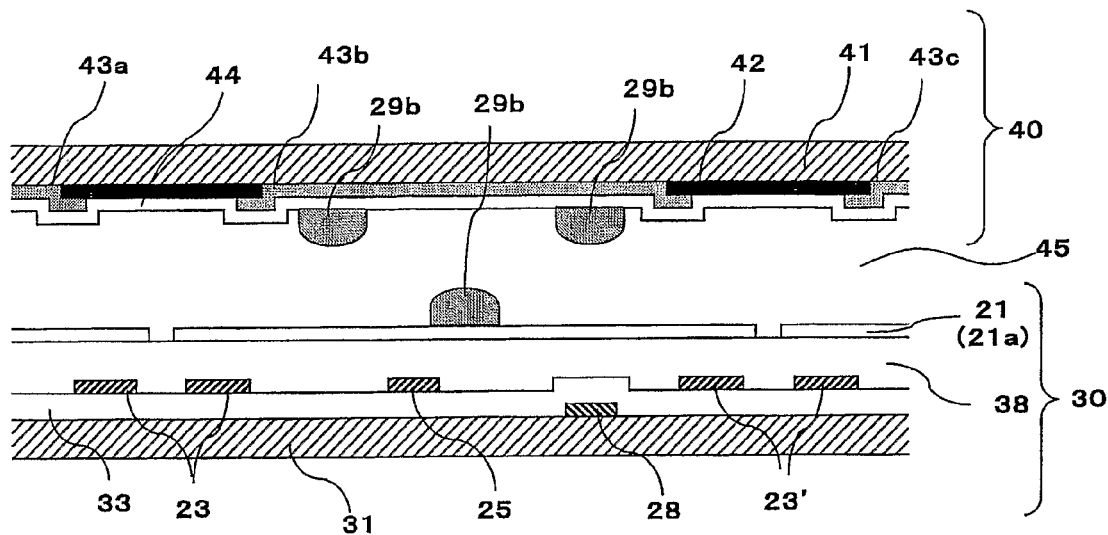
FIG. 17 is a schematic sectional view showing an example of the active matrix substrate taken along line D-D' shown in FIG. 16.
Figure 18:
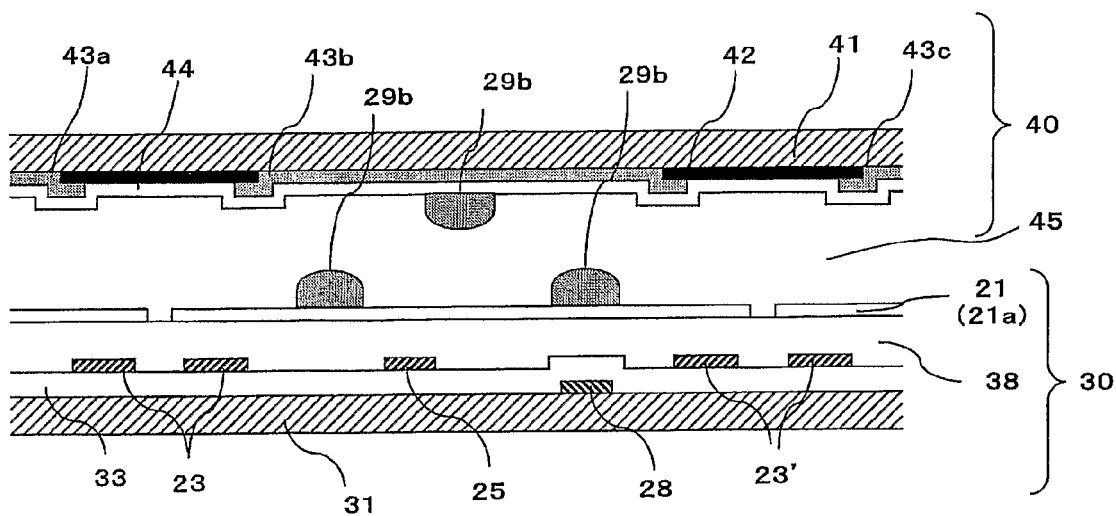
FIG. 18 is a schematic sectional view showing another example of the active matrix substrate taken along line D-D' shown in FIG. 16.

An embodiment 7 of the present invention will be described with reference to FIGS. 16 to 18. FIG. 16 is a schematic plan view showing a constitution of a pixel of an active matrix substrate according to the embodiment 7. FIGS. 17 and 18 are schematic sectional views showing an example of a section of the active matrix substrate taken along line D-D' shown in FIG. 16.

According to the present invention, as shown in FIG. 16, the interconnection electrodes for correction 28 and 28' may be formed by arranging the interconnection electrodes for correction 28 and 28' so as to overlap with the protrusion for controlling an alignment 29*b* of the active matrix substrate or the protrusion for controlling an alignment 29*b* of an opposed substrate, without reducing an aperture ratio.

The protrusion for controlling an alignment 29*b* of the active matrix substrate and the protrusion for controlling an alignment 29*b* of the opposed substrate are a protrusion for controlling an alignment of a liquid crystal, which is formed on the substrate in an MVA vertical aligned liquid crystal display device used in a large liquid crystal TV and the like.

In addition, the pattern configuration of the interconnection electrodes for correction 28 and 28' is a rectangle as shown in FIG. 16 in this embodiment, the pattern configuration of the interconnection electrodes for correction 28 and 28' is not limited to the above, and it may be a triangle, a semicircle, a trapezoid and the like. That is, it is preferable that the interconnection electrodes for correction 28 and 28' partly overlaps with the patterns of the drain extraction wiring 25 and the (next-stage) data signal line 23' through the gate insulator 33, and they are arranged so as to overlap with the protrusion for controlling an alignment 29*b* of the active matrix substrate or the protrusion for controlling an alignment 29*b* of the opposed substrate.

The configuration of the protrusion for controlling an alignment 29*b* of the active matrix substrate and the protrusion for controlling an alignment 29*b* of the opposed substrate is a rectangle as shown in FIG. 16 according to this embodiment, but the pattern configuration of the protrusion for controlling an alignment 29*b* is not limited to the above, and it is preferable that it may be formed so that a desired viewing angle and visual characteristics may be obtained.

Embodiment 8

Figure 19:
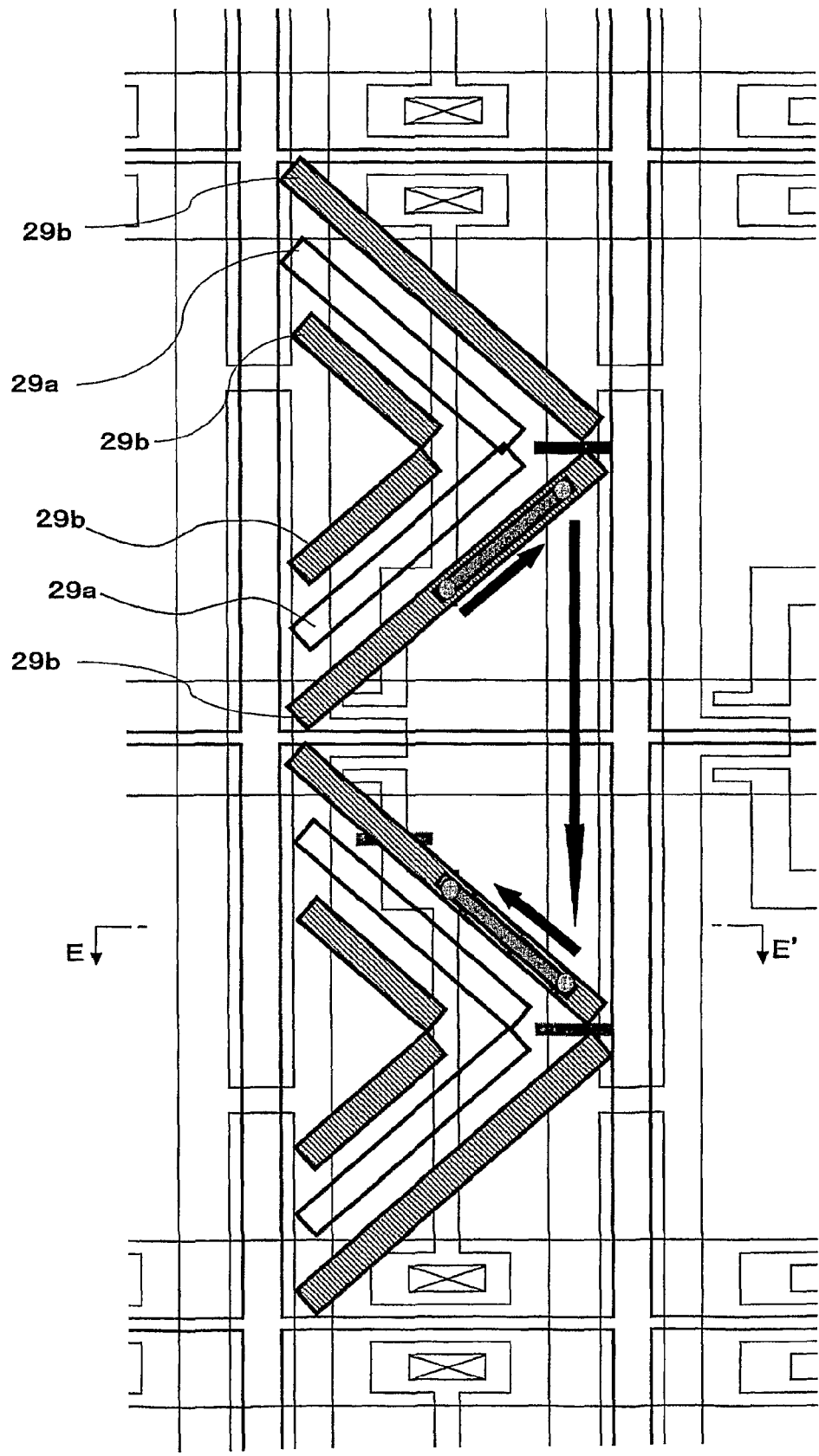
FIG. 19 is a schematic plan view showing a constitution of a pixel of an active matrix substrate according to an embodiment 8.
Figure 20:
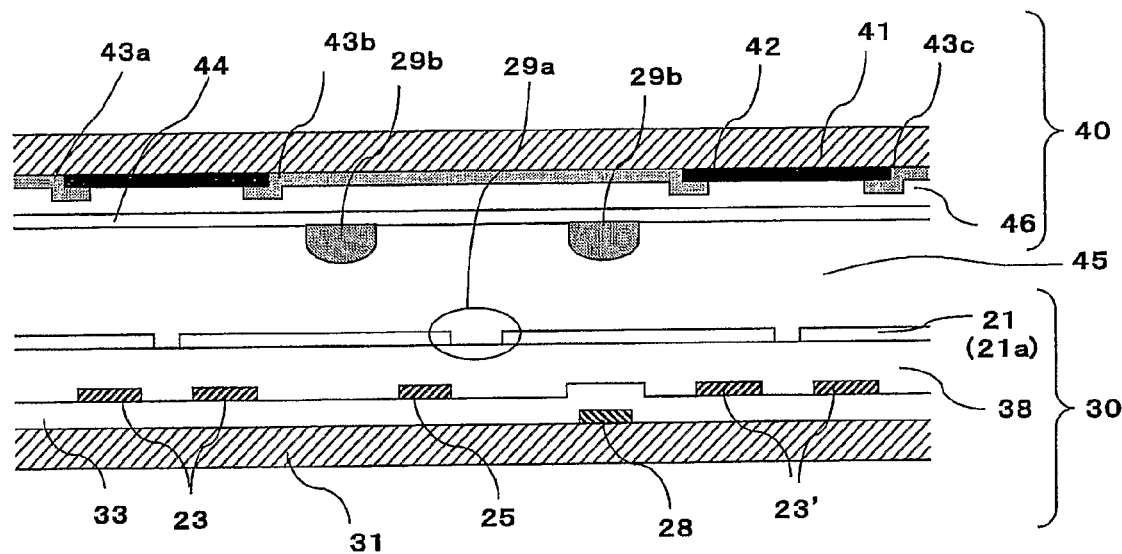
FIG. 20 is a schematic sectional view showing an example of the active matrix substrate taken along line E-E' shown in FIG. 19.
Figure 21:
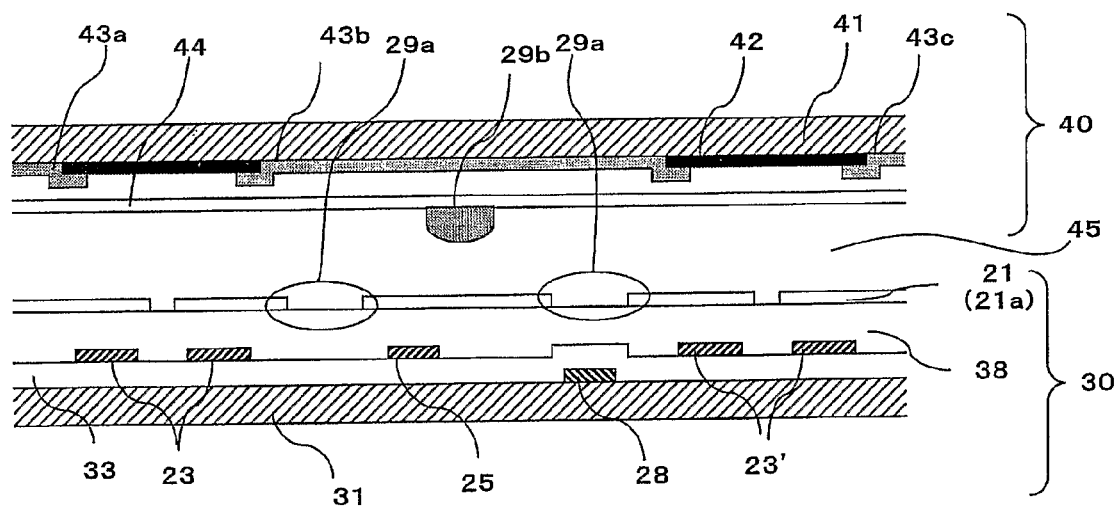
FIG. 21 is a schematic sectional view showing another example of the active matrix substrate taken along line E-E' shown in FIG. 19.

An embodiment 8 of the present invention will be described with reference to FIGS. 19 to 21. FIG. 19 is a schematic plan view showing a constitution of a pixel of an active matrix substrate according to the embodiment 8. FIGS. 20 and 21 are schematic sectional views showing an example of a section of the active matrix substrate taken along line E-E' shown in FIG. 19.

As shown in FIG. 19, there is a case where the protrusion for controlling an alignment 29*b* and the electrode slit 29*a* are used together in an MVA vertical aligned liquid crystal display device used in a large liquid crystal TV and the like. According to the present invention, the interconnection electrodes for correction 28 and 28' may be formed by arranging the interconnection electrodes for correction 28 and 28' so as to overlap with the protrusion for controlling an alignment 29*b* and the pixel electrode slit 29*a* of the active matrix substrate or the protrusion for controlling an alignment 29*b* and the opposed electrode slit 29*a* of an opposed substrate, without further reducing an aperture ratio.

In addition, the pattern configuration of the interconnection electrodes for correction 28 and 28' is a rectangle as shown in FIG. 19 in this embodiment, but the pattern configuration of the interconnection electrodes for correction 28 and 28' is not limited to the above, and it may be a triangle, a semicircle, a trapezoid and the like. That is, it is preferable that interconnection electrodes for correction 28 and 28' partly overlap with the patterns of the drain extraction wiring 25 and the (next-stage) data signal line 23' through the gate insulator 33, and overlap with the protrusion for controlling an alignment 29*b* or the electrode slit 29*a*.

The configurations of the protrusion for controlling an alignment 29*b* and the electrode slit 29*a* are a rectangle as shown in FIG. 19 according to this embodiment, but the pattern configuration of the protrusion for controlling an alignment 29*b* and the electrode slit 29*a* is not limited to the above, and it is preferable that it may be formed so that a desired viewing angle and visual characteristics may be obtained.

Embodiment 9

Figure 22:
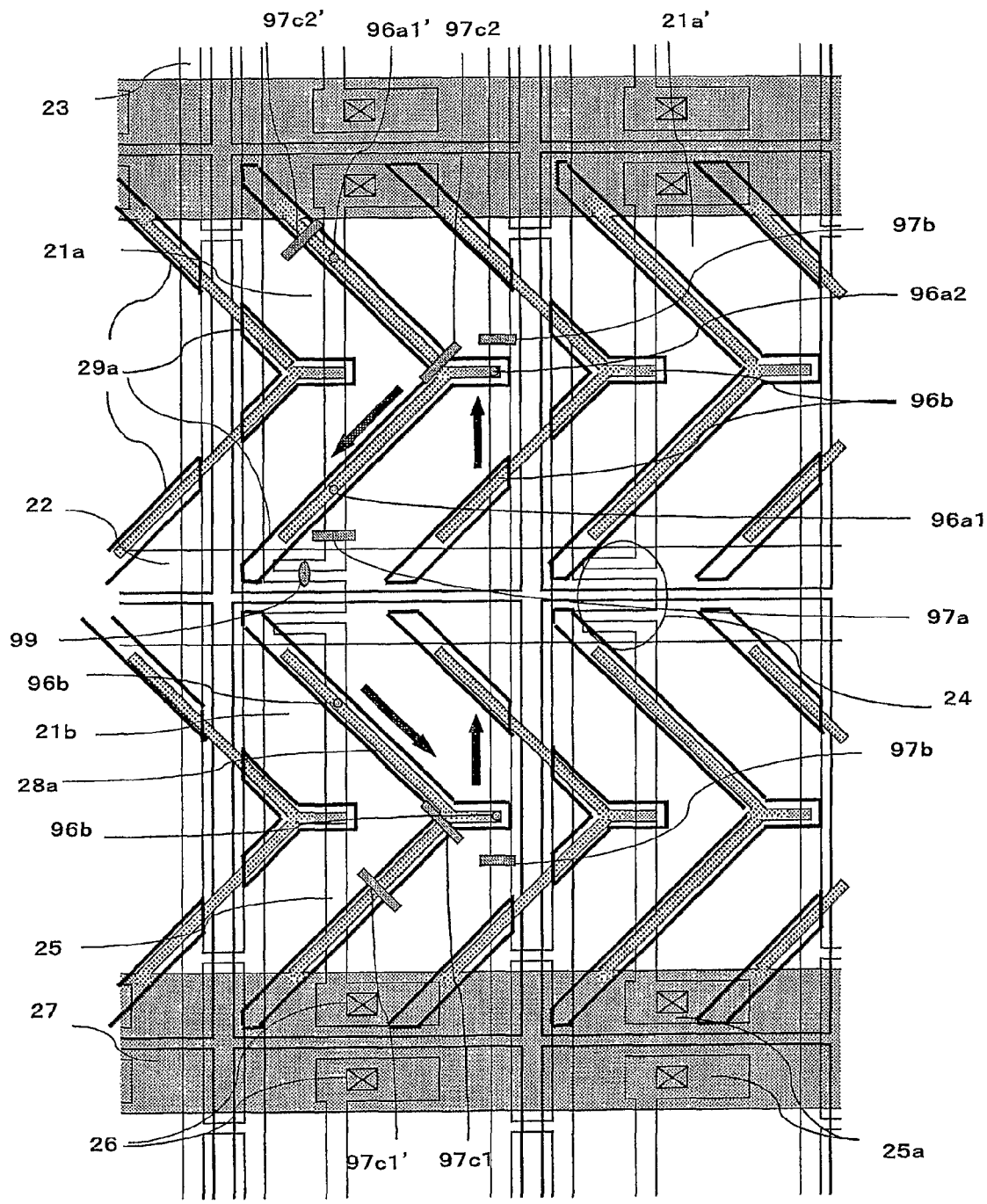
FIG. 22 is a schematic plan view showing a constitution of a pixel of an active matrix substrate according to an embodiment 9.
Figure 23:
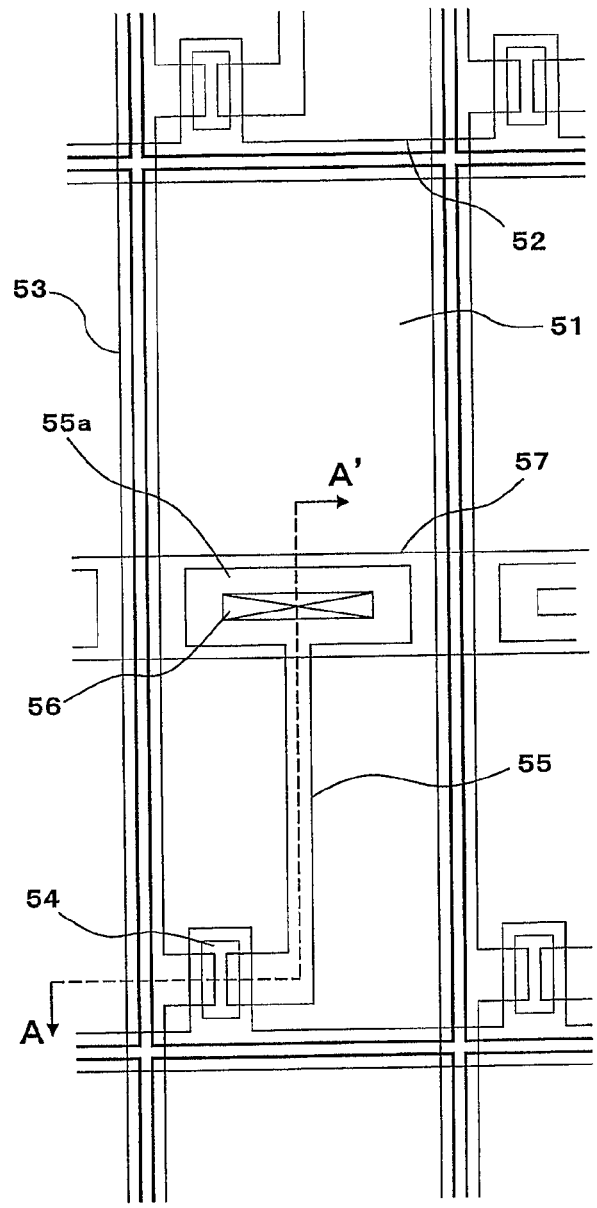
FIG. 23 is a schematic plan view showing a pixel of an active matrix substrate provided in a conventional active matrix liquid crystal display device.
Figure 24:
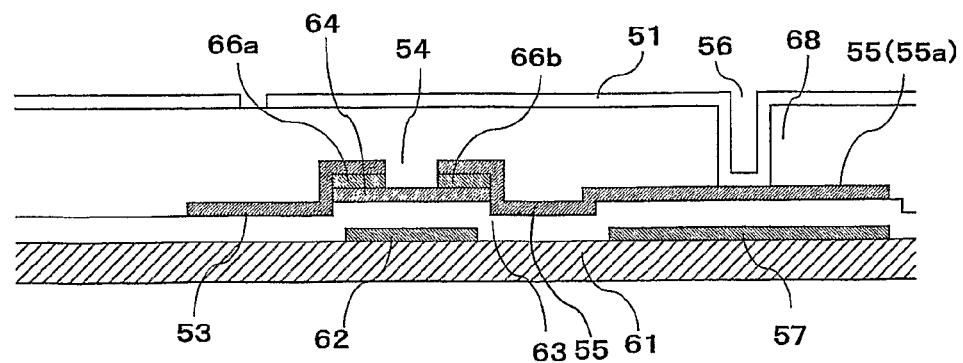
FIG. 24 is a schematic sectional view showing the pixel of the conventional active matrix substrate taken along line A-A' shown in FIG. 23.

An embodiment 9 of the present invention will, hereinafter, be descried with reference to FIG. 22. FIG. 22 is a schematic plan view showing a constitution of a pixel of an active matrix substrate according to the embodiment 9. As shown in FIG. 22, according to this embodiment, the interconnection electrode for correction 28*a* elongated from the storage capacitor wiring 27 is arranged so as to overlap with the pixel electrode slit 29*a* of the active matrix substrate.

The pixel electrode slit 29*a* of the active matrix substrate is an electrode pattern for controlling a divided alignment of the liquid crystal which is formed on the substrate in an MVA vertically aligned liquid crystal display device used in a large liquid crystal TV.

According to this embodiment, since the electrode 28*a* (which is an elongated part of the storage capacitor wiring 27 and also the electrode for correction) having a potential different from that of the (sub-) pixel electrodes 21*a* and 21*b* is arranged under the pixel electrode slit 29*a*, a fringe field effect in the pixel electrode slit 29*a* is sufficiently provided and a power of control for aligning the liquid crystal may be improved.

In addition, since the interconnection electrode for correction 28*a* is formed under the pixel electrode slit 29*a* which does not contribute to an aperture ratio, the aperture ratio is not further reduced.

In addition, a pattern configuration of the interconnection electrode for correction 28*a* is not limited to the one shown in FIG. 22, and it may be appropriately adjusted according to a configuration of the pixel electrode slit 29*a* or a pattern of the storage capacitor wiring 27. In addition, it is not necessary that the entire patterns of the interconnection electrode for correction 28*a* are in the region of the pixel electrode slit 29*a*. For example, a wiring and the like which connects the interconnection electrodes for correction to each other arranged under the plurality of pixel electrode slits 29*a* formed in the pixel may be provided in a part other than the lower part of the pixel electrode slit 29*a*.

In addition, it is preferable that the interconnection electrode 28*a* formed by separating the elongated part of the storage capacitor wiring 27 (in the pixel adjacent to the pixel defect) is separated so that an area of the region overlapping with the pixel electrode slit 29*a* may be a minimum. According to this embodiment, the area in which the interconnection electrode for correction 28*a* overlaps with the pixel electrode slit 29*a* becomes smaller when it is separated in a laser irradiation part 97*c*1 as compared with the laser irradiation part 97*c*1'. In addition, according to this embodiment, in the case where the interconnection electrode for correction 28*a* is connected to the data signal line 23 and the drain extraction wiring 25 in the laser irradiation part 96*b*, the area in which the interconnection electrode for correction 28*a* overlaps with the pixel electrode slit 29*a* becomes smallest when it is separated in the laser irradiation part 97*c*1.

According to this embodiment, in order to connect the interconnection electrode for correction 28*a* to the drain extraction wiring 25 in the pixel in which the pixel defect is generated, the laser may be applied to the laser irradiation part 96*a*1 or may be applied to the laser irradiation part 96*a*1'. In addition, it is preferable that the laser is applied to the laser irradiation part 96*a*1. The reason is that in the case where the interconnection electrode for correction 28*a* is connected to the drain extraction wiring 25 by irradiating the laser irradiation part 96*a*1' with the laser, the laser irradiation part becomes the laser irradiation part 97*c*2' because the interconnection electrode for correction 28*a* is separated from the elongated part of the storage capacitor wiring 27. On the other hand, in the case where the laser is applied to the laser irradiation part 96*a*1, the laser irradiation part 97*c*2 may be used as the laser irradiation part to separate the interconnection electrode for correction 28*a* from the elongated part of the storage capacitor wiring 27. Therefore, as compared with the case where the laser irradiation part 97*c*2' is selected, the elongated part of the storage capacitor wiring 27 is prevented from being reduced by about one slit and the reduction of the elongated part of the storage capacitor wiring 27 overlapping with the pixel electrode slit 29*a* may become a minimum. Thus, the fringe field effect because of the pixel electrode slit 29*a* may be provided more by about one slit.

In addition, this Nonprovisional application claims priority under 35 U.S.C. §119(a) on Patent Application No. 2004-158127 filed in Japan on May 27, 2004 and Patent Application No. 2004-332472 filed in Japan on Nov. 16, 2004, and Patent Application No. 20005-096262 filed in Japan on Mar. 29, 2005, the entire contents of which are hereby incorporated by reference.

The invention claimed is:

1. An active matrix substrate comprising:
a plurality of scanning signal lines and data signal lines supported by a substrate; a thin film transistor provided proximate an intersecting point of the signal lines and comprising a gate electrode connected to the scanning signal line, and a source electrode connected to the data signal line; and
a pixel electrode electrically connected to a drain electrode of the thin film transistor,
wherein the data signal line comprises an at least partly multilinear part,
the active matrix substrate comprises a wiring structure having an overlapping part of a part of the wiring structure and the multilinear part of the data signal line, an overlapping part of a part of the wiring structure and a circuit part connecting the thin film transistor to the pixel electrode, and at least one of the overlapping parts provided through an insulating film, the multilinear part of the data signal line comprising first and second substantially parallel sections that are located between TFTs of adjacent pixel regions, the first and second substantially parallel sections of the multilinear part being electrically connected during normal display operation in absence of defects but being adapted to be electrically separated upon occurrence of a defect.

2. The active matrix substrate according to claim 1, wherein the circuit part connecting the thin film transistor to the pixel electrode is one of at least one conductive portion selected from a group consisting of the drain electrode of the thin film transistor, a drain extraction wiring and a storage capacitor upper electrode, and an elongated part of the conductive portion.

3. The active matrix substrate according to claim 1, wherein the wiring structure is provided as a layer comprising the scanning signal line.

4. The active matrix substrate according to claim 1, wherein the active matrix substrate comprises a storage capacitor wiring, and the wiring structure has a structure elongated from the storage capacitor wiring.

5. The active matrix substrate according to claim 1, wherein the wiring structure partly overlaps with one of an electrode elongated from the drain extraction wiring and an electrode elongated from the storage capacitor upper electrode connected to the drain extraction wiring through the insulation film.

6. The active matrix substrate according to claim 1 comprising two or more wiring structures in one pixel.

7. The active matrix substrate according to claim 6, wherein the pixel comprises two or more sub-pixels and one or more wiring structures are provided in the sub-pixel.

8. The active matrix substrate according to claim 1, wherein the wiring structure overlaps with the data signal line through the insulation film, and with one of the drain electrode and the drain extraction wiring through the insulation film, respectively by 25 $\mu m^2$ or more.

9. The active matrix substrate according to claim 1, wherein the wiring structure is formed of a material comprising at least one kind selected from the group consisting of Al, Cr, Ta, Ti, W, Mo and Cu.

10. The active matrix substrate according to claim 1, wherein the wiring structure overlaps with one of a protrusion for controlling an alignment of a liquid crystal molecule and an electrode slit.

11. The active matrix substrate according to claim 1, wherein the wiring structure is elongated from a storage capacitor wiring and overlaps with the electrode slit.

12. A liquid crystal display device comprising the active matrix substrate according to claim 1.

13. A method for correcting a pixel defect generated in an active matrix substrate, the active matrix substrate comprising a plurality of scanning signal lines and data signal lines supported by a substrate; a thin film transistor provided at proximate an intersecting point of the signal lines and comprising a gate electrode connected to the scanning signal line, and a source electrode connected to the data signal line; and a pixel electrode electrically connected to a drain electrode of the thin film transistor, wherein the data signal line comprises an at least partly multilinear part, the active matrix substrate comprises a wiring structure having an overlapping part of a part of the wiring structure and the multilinear part of the data signal line, an overlapping part of a part of the wiring structure and a circuit part connecting the thin film transistor to the pixel electrode, and at least one of the overlapping parts provided through an insulating film, the multilinear part of the data signal line comprising first and second substantially parallel sections that are located between TFTs of adjacent pixel regions, the first and second substantially parallel sections of the multilinear part being electrically connected during normal display operation in absence of defects but being adapted to be electrically separated upon occurrence of a defect, said method comprising:

connecting a pixel electrode having a generated pixel defect to one of adjacent pixel electrodes over one of the scanning signal line and the storage capacitor wiring through the wiring structure to be substantially the same potential.

14. The method for correcting the pixel defect in the active matrix substrate according to claim 13, comprising a step of connecting the data signal line to one of the drain extraction electrode and the storage capacitor upper electrode through the wiring structure.

15. The method for correcting the pixel defect in the active matrix substrate according to claim 14, wherein the connecting step is performed by melting an overlapping region of the wiring structure and the data signal line, and an overlapping region of the wiring structure and one of the drain extraction electrode and the storage capacitor upper electrode by laser irradiation.

16. The method for correcting the pixel defect in the active matrix substrate according to claim 13, comprising a step of separating a part of the data signal line connected to the wiring structure.

17. The method for correcting the pixel defect in the active matrix substrate according to claim 13, wherein a part of the data signal line connected to the wiring structure crosses the storage capacitor wiring.

18. The method for correcting the pixel defect in the active matrix substrate according to claim 13, comprising a step of separating a part of the data signal line connected to the pixel electrode having a generated pixel defect through the thin film transistor.

19. The method for correcting the pixel defect in the active matrix substrate according to claim 13, wherein one of one part and a whole of an elongated part of the storage capacitor wiring is separated.

20. The method for correcting the pixel defect in the active matrix substrate according to claim 19, wherein one of the one part and the whole of the elongated part of the storage capacitor wiring is separated so that an overlapping region of the wiring structure and the electrode slit may be a minimum.

21. A manufacturing method of an active matrix substrate comprising a step of correcting a pixel defect by the method for correcting the pixel defect in the active matrix substrate according to claim 13.

22. A manufacturing method of a liquid crystal display device comprising a step of manufacturing the active matrix substrate by the method for correcting the pixel defect in the active matrix substrate according to claim 13.

23. An active matrix substrate comprising on the substrate:
a plurality of scanning signal lines and data signal lines;
a thin film transistor provided proximate an intersecting point of the signal lines and comprising a gate electrode connected to the scanning signal line, a source electrode connected to the data signal line, and a drain electrode; and
a pixel electrode connected to one of the drain electrode of the thin film transistor and a drain extraction wiring,
wherein the active matrix substrate comprises a structure having an at least partly multilinear data signal line and an interconnection electrode for correction, the multilinear data signal line comprising first and second substantially parallel sections that are located between TFTs of adjacent pixel regions, the first and second substantially parallel sections of the multilinear data signal line being electrically connected during normal display operation in absence of defects but being adapted to be electrically separated upon occurrence of a defect; and
wherein the interconnection electrode for correction partly overlaps with the data signal line through an insulation film.

24. The active matrix substrate according to claim 23, wherein the interconnection electrode for correction partly overlaps with one of the drain electrode and the drain extraction wiring through the insulation film.

25. The active matrix substrate according to claim 23, wherein the interconnection electrode for correction is provided as a layer comprising the scanning signal line.

26. The active matrix substrate according to claim 23, wherein the active matrix substrate comprises a storage capacitor wiring, and the interconnection electrode for correction has a structure elongated from the storage capacitor wiring.

27. The active matrix substrate according to claim 23, wherein the interconnection electrode for correction partly overlaps with one of an electrode elongated from the drain extraction wiring and an electrode elongated from the storage capacitor upper electrode connected to the drain extraction wiring through the insulation film.

28. The active matrix substrate according to claim 23, comprising two or more interconnection electrodes for correction in one pixel.

29. A liquid crystal display device comprising the active matrix substrate according to claim 23.

30. An active matrix substrate comprising on the substrate:
a plurality of scanning signal lines and data signal lines;
a thin film transistor provided proximate an intersecting point of the signal lines and comprising a gate electrode connected to the scanning signal line, a source electrode connected to the data signal line, and a drain electrode; and
a pixel electrode connected to one of the drain electrode of the thin film transistor and a drain extraction wiring,
wherein the active matrix substrate comprises a structure having an at least partly multilinear data signal line and an interconnection electrode for correction, the multilinear data signal line comprising first and second substantially parallel sections that are located between TFTs of adjacent pixel regions, the first and second substantially parallel sections of the multilinear data signal line being electrically connected during normal display operation in absence of defects but being adapted to be electrically separated upon occurrence of a defect;
wherein there are two or more interconnection electrodes for correction in one pixel; and
wherein the pixel comprises two or more sub-pixels and one or more interconnection electrodes for correction in the sub-pixel.

31. An active matrix substrate comprising on the substrate:
a plurality of scanning signal lines and data signal lines;
a thin film transistor provided proximate an intersecting point of the signal lines and comprising a gate electrode connected to the scanning signal line, a source electrode connected to the data signal line, and a drain electrode; and a pixel electrode connected to one of the drain electrode of the thin film transistor and a drain extraction wiring, wherein the active matrix substrate comprises a structure having an at least partly multilinear data signal line and an interconnection electrode for correction, the multilinear data signal line comprising first and second substantially parallel sections that are located between TFTs of adjacent pixel regions, the first and second substantially parallel sections of the multilinear data signal line being electrically connected during normal display operation in absence of defects but being adapted to be electrically separated upon occurrence of a defect; and wherein the interconnection electrode for correction overlaps with the data signal line through the insulation film, and with one of the drain electrode and the drain extraction wiring through the insulation film, respectively by 25 µm² or more.

32. An active matrix substrate comprising on the substrate:
a plurality of scanning signal lines and data signal lines;
a thin film transistor provided proximate an intersecting point of the signal lines and comprising a gate electrode connected to the scanning signal line, a source electrode connected to the data signal line, and a drain electrode; and a pixel electrode connected to one of the drain electrode of the thin film transistor and a drain extraction wiring, wherein the active matrix substrate comprises a structure having an at least partly multilinear data signal line and an interconnection electrode for correction, the multilinear data signal line comprising first and second substantially parallel sections that are located between TFTs of adjacent pixel regions, the first and second substantially parallel sections of the multilinear data signal line being electrically connected during normal display operation in absence of defects but being adapted to be electrically separated upon occurrence of a defect; and wherein the interconnection electrode for correction overlaps with one of a protrusion for controlling an alignment of a liquid crystal molecule and an electrode slit.

33. An active matrix substrate comprising on the substrate:
a plurality of scanning signal lines and data signal lines;
a thin film transistor provided proximate an intersecting point of the signal lines and comprising a gate electrode connected to the scanning signal line, a source electrode connected to the data signal line, and a drain electrode; and a pixel electrode connected to one of the drain electrode of the thin film transistor and a drain extraction wiring, wherein the active matrix substrate comprises a structure having an at least partly multilinear data signal line and an interconnection electrode for correction, the multilinear data signal line comprising first and second substantially parallel sections that are located between TFTs of adjacent pixel regions, the first and second substantially parallel sections of the multilinear data signal line being electrically connected during normal display operation in absence of defects but being adapted to be electrically separated upon occurrence of a defect; and wherein the interconnection electrode for correction is elongated from a storage capacitor wiring and overlaps with an electrode slit.

34. A method for correcting a pixel defect generated in the active matrix substrate comprising on the substrate: a plurality of scanning signal lines and data signal lines; a thin film transistor provided proximate an intersecting point of the signal lines and comprising a gate electrode connected to the scanning signal line, a source electrode connected to the data signal line, and a drain electrode; and a pixel electrode connected to one of the drain electrode of the thin film transistor and a drain extraction wiring, wherein the active matrix substrate comprises a structure having an at least partly multilinear data signal line and an interconnection electrode for correction, the multilinear data signal line comprising first and second substantially parallel sections that are located between TFTs of adjacent pixel regions, the first and second substantially parallel sections of the multilinear data signal line being electrically connected during normal display operation in absence of defects but being adapted to be electrically separated upon occurrence of a defect;

wherein the method comprises the pixel electrode having a generated pixel defect is connected to one of adjacent pixel electrodes over one of the scanning signal line and the storage capacitor wiring through the interconnection electrode for correction to be substantially the same potential.

35. The method for correcting the pixel defect in the active matrix substrate according to claim 34, comprising a step of connecting the data signal line to one of the drain extraction electrode and the storage capacitor upper electrode through the interconnection electrode for correction.

36. The method for correcting the pixel defect in the active matrix substrate according to claim 35, wherein the connecting step is performed by melting an overlapping region of the interconnection electrode for correction and the data signal line, and an overlapping region of the interconnection electrode for correction and one of the drain extraction electrode and the storage capacitor upper electrode by laser irradiation.

37. The method for correcting the pixel defect in the active matrix substrate according to claim 34, comprising a step of separating a part of the data signal line connected to the interconnection electrode for correction.

38. The method for correcting the pixel defect in the active matrix substrate according to claim 34, wherein a part of the data signal line connected to the interconnection electrode for correction crosses the storage capacitor wiring.

39. The method for correcting the pixel defect in the active matrix substrate according to claim 34, comprising a step of separating a part of the data signal line connected to the pixel electrode having a generated pixel defect through the thin film transistor.

40. The method for correcting the pixel defect in the active matrix substrate according to claim 34, wherein one of one part and a whole of an elongated part of the storage capacitor wiring is separated.

41. The method for correcting the pixel defect in the active matrix substrate according to claim 40, wherein one of the one part and the whole of the elongated part of the storage capacitor wiring is separated so that an overlapping region of the interconnection electrode for correction and the electrode slit may be a minimum.

42. A manufacturing method of an active matrix substrate comprising a step of correcting a pixel defect by the method for correcting the pixel defect in the active matrix substrate according to claim 34.

43. A manufacturing method of a liquid crystal display device comprising a step of manufacturing the active matrix substrate by the method for correcting the pixel defect in the active matrix substrate according to claim 34.

* * * * *